US010798852B2

(12) United States Patent
Deev et al.

(10) Patent No.: US 10,798,852 B2
(45) Date of Patent: Oct. 6, 2020

(54) METHOD OF CONTROLLING COOLING IN SERVER ROOM AND SYSTEM IMPLEMENTING THEREOF

(71) Applicant: YANDEX EUROPE AG, Lucerne (CH)

(72) Inventors: Mikhail Mikhailovich Deev, Moscow (RU); Aleksandr Alekseevich Konovalov, Krasnogorsk (RU); Petr Leonidovich Ronzhin, Balashikha (RU)

(73) Assignee: YANDEX EUROPE AG, Lucerne (CH)

( * ) Notice: Subject to any disclaimer, the term of this patent is extended or adjusted under 35 U.S.C. 154(b) by 135 days.

(21) Appl. No.: 16/149,425

(22) Filed: Oct. 2, 2018

(65) Prior Publication Data
US 2019/0166727 A1 May 30, 2019

(30) Foreign Application Priority Data
Nov. 30, 2017 (RU) ................. 2017141734

(51) Int. Cl.
*H05K 7/20* (2006.01)
*G05B 15/02* (2006.01)
(Continued)

(52) U.S. Cl.
CPC .......... *H05K 7/20836* (2013.01); *F24F 11/74* (2018.01); *G05B 15/02* (2013.01);
(Continued)

(58) Field of Classification Search
USPC ....................................................... 700/300
See application file for complete search history.

(56) References Cited

U.S. PATENT DOCUMENTS 6,646,877 B2 11/2003 Willers et al.
8,483,883 B1 7/2013 Watson
(Continued)

FOREIGN PATENT DOCUMENTS

CN 104182018 A 12/2014
EP 2586281 B1 8/2017
(Continued)

OTHER PUBLICATIONS

English Abstract for CN104182018 retrieved on Espacenet on Mar. 30, 2018.
(Continued)

*Primary Examiner* — Emilio J Saavedra
(74) *Attorney, Agent, or Firm* — BCF LLP

(57) ABSTRACT

An air flow control method and system for cooling a data center including a server room is disclosed. The method including receiving a first differential pressure value of an air pressure of a first chamber relative to the air pressure of the outside area; receiving a second differential pressure value of the air pressure of a second chamber relative to the air pressure of the outside area; generating a first control signal to adjust the speed of an inlet fan based on the first differential pressure value; generating a second control signal to adjust an outlet fan speed based on the second differential pressure value; transmitting the control signals to the respective inlet and outlet fans to adjust the first differential pressure value to a first target value, and adjust the second differential pressure value to a second target value.

21 Claims, 5 Drawing Sheets

(51) Int. Cl.
*G06F 1/20* (2006.01)
*F24F 11/74* (2018.01)

(52) U.S. Cl.
CPC .............. *G06F 1/20* (2013.01); *H05K 7/20* (2013.01); *H05K 7/20709* (2013.01); *H05K 7/20745* (2013.01)

(56) References Cited

U.S. PATENT DOCUMENTS

| | | |
|---|---|---|
| 9,072,196 B2 | 6/2015 | Bauchot et al. |
| 9,182,139 B2 | 11/2015 | Fujimura et al. |
| 9,237,680 B2 | 1/2016 | Murayama et al. |
| 9,760,098 B1 | 9/2017 | Imwalle et al. |
| 2007/0074525 A1 | 4/2007 | Vinson et al. |
| 2009/0034187 A1 | 2/2009 | Coles et al. |
| 2011/0021133 A1 | 1/2011 | Zwern |
| 2011/0128699 A1 | 6/2011 | Heydari et al. |
| 2012/0041600 A1* | 2/2012 | Michael ............. G05D 23/1932 700/276 |
| 2012/0087087 A1 | 4/2012 | Nicolai et al. |
| 2013/0245836 A1* | 9/2013 | Goodfellow ......... F24F 11/0001 700/276 |
| 2014/0014292 A1* | 1/2014 | Rice ................... H05K 7/20836 165/11.1 |
| 2015/0003010 A1 | 1/2015 | Kinstle |
| 2016/0050797 A1 | 2/2016 | Smith |
| 2017/0159951 A1* | 6/2017 | Slessman ................ F24F 11/76 |
| 2017/0164522 A1 | 6/2017 | Wong et al. |

FOREIGN PATENT DOCUMENTS

| | | |
|---|---|---|
| GB | 2478779 B | 4/2017 |
| RU | 2510523 C2 | 3/2014 |
| RU | 2557782 C2 | 7/2015 |
| RU | 2623722 C2 | 6/2017 |
| TW | I497265 B | 8/2015 |
| TW | 201626147 A | 7/2016 |
| TW | M575131 U | 3/2019 |

OTHER PUBLICATIONS

Office Action with regard to the counterpart TW Patent Application No. 107128822 dated Dec. 23, 2019.
English Abstract for TWM575131 retrieved on Espacenet on Jan. 9, 2020.
Search Report with regard to the counterpart RU Patent Application No. 2017141734 dated Mar. 5, 2019.
Office Action with regard to the counterpart TW Patent Application No. 107128822 received on Aug. 23, 2019.
English Abstract for TW201626147 retrieved on Espacenet on Sep. 19, 2019.
English Abstract for TWI497265 retrieved on Espacenet on Sep. 19, 2019.

\* cited by examiner

METHOD OF CONTROLLING COOLING IN SERVER ROOM AND SYSTEM IMPLEMENTING THEREOF

CROSS-REFERENCE

The present application claims priority to Russian Patent Application No. 2017141734, entitled "Method Of Controlling Cooling In Server Room And System Implementing Thereof", filed Nov. 30, 2017, the entirety of which is incorporated herein by reference.

FIELD

The present technology generally relates to cooling servers and, more particularly, to a system and method for controlling cooling in a server room.

BACKGROUND

In 1965, the co-founder of Intel Corp., Gordon Moore made the observation that the number of transistors in a dense integrated circuit doubles approximately every two years. Commonly known as "Moore's law", this observation has proven to be accurate for several decades (and continues to be) in the semiconductor industry. One of the technical reasons for Moore's law is the ability, by the semiconductor fabrication industry, to shorten the distance between the pathways inside the silicon chips each successive generation.

While shrinking silicon pathways create higher performing chips, tightly packing the pathways together creates other problems to be considered. One of such problems is the heat generated by the tightly packed electrons—which unless the chip is cooled down, can melt down inside its packaging and further damage the surrounding hardware.

Generally speaking, computers have fans installed for drawing in air and exhausting the heated air for cooling down the chips. Needless to say, although such fans may be enough for certain computers (such as personal computers), it is not enough to cool down the chips found in servers in a data center. Indeed, most corporate data centers have elaborate, expensive air conditioning and venting systems to prevent overheating of the chips.

There exist several approaches for cooling down servers found in a data center. A common approach is to control the amount of air to be blown into the chamber containing the servers based on the sensed temperature of the servers. Another common approach is to cool the air (using a cooling device) entering the server room.

While such approach may be useful, it also has several downsides. For example, the amount of information to be processed, as well as the need for controlling different hardware (such as the cooling device), requires a significant amount of computational power and computational resources.

U.S. Pat. No. 9,237,680 (published on Jun. 28, 2012) discloses an air conditioning system for managing a server room which has first and second spaces separated from each other, in which a server is installed between the first and second spaces, and supply air flowed into the first space is heated by heat generation of the server, and flows out as return air via the second space, includes: a cold air generation device; an air supply fan; a first differential pressure gauge; and a control device. The cold air generation device generates supply air satisfying a predetermined condition. The air supply fan flows the generated supply air into the first space. The first differential pressure gauge measures a differential pressure of a static pressure of the second space with respect to a static pressure of the first space.

US 2015/003010 (published on Jan. 1, 2015) discloses a pressure-activated server cooling system that includes a server rack that houses one or more servers. The server rack has an interior plenum. A fan is coupled to the server rack that exhausts air from inside the plenum to outside the server rack. A differential pressure sensor collects pressure sensor data and a fan controller, which is operatively connected to the fan and the differential pressure sensor, activates the fan in response to the pressure sensor data. In some embodiments, the fan controller increases the speed of the fan when the pressure sensor data indicates greater than atmospheric pressure in the plenum.

SUMMARY

It is an object of the present technology to provide improved method and system for controlling air flow for cooling a server room. As such, it will be apparent to those skilled in the art that the present technology aims at controlling the air flow for cooling a server room in a more efficient manner, thus improving energy consumption and decreasing computational burden on the controlling systems.

In developing the present technology, developers noted that servers within a data center are typically housed in a server rack. These server racks generally comprise one or more large "rack fans" located behind the servers configured to draw cool air from a cold chamber into the servers and exhaust the heated air into a hot chamber. Developers noted that even with the combined use of the "rack fans" and the "server fans", these fans are insufficient to passively mitigate the build up of heat and pressure within the servers.

Without wishing to be bound to any specific theory, embodiments of the present technology have been developed based on the thermodynamic principles known in the art that a better flow of air is achieved when the air pressure within the cold chamber is higher than the air pressure within the hot chamber. Thus, by monitoring and selectively controlling the air pressures within the cold and hot chambers, some embodiments of the present technology may provide a more economic and resource efficient manner of preventing over heating of the serves in a data center.

According to a broad aspect of the present technology, there is provided an air flow control method for cooling a data center comprising a server room. The server room comprises a first chamber and a second chamber partitioned therebetween by a server rack and being in fluid communication therebetween via the server rack. The first chamber has an air inlet fluidly coupled to an outside area of the server room, and the second chamber has an air outlet fluidly coupled to the outside area. The method is executable by a controller unit coupled to an inlet fan configured to flow air from the outside area into the first chamber at different speeds, via the air inlet; an outlet fan configured to flow air from the second chamber into the outside area at different speeds, via the air outlet; a first differential pressure gauge configured to measure a first differential pressure value of an air pressure of the first chamber relative to an air pressure of the outside area; a second differential pressure gauge configured to measure a second differential pressure value of an air pressure of the second chamber relative to the air pressure of the outside area. The method comprises: receiving the first differential pressure value from the first differential pressure gauge; receiving the second differential pressure value from the second differential pressure gauge;

generating a first control signal to adjust the speed of the inlet fan based on the first differential pressure value; generating a second control signal to adjust the speed of the outlet fan based on the second differential pressure value; transmitting the first and second control signals to the respective inlet and outlet fans to adjust the first differential pressure value to a first target value, and adjust the second differential pressure value to a second target value, the first target value being above the second target value, thereby maintaining a flow of air from the first chamber to the second chamber.

In some embodiments of the method, the generating the first control signal is executed independently from the generating the second control signal In some embodiments of the method, the controller unit is configured to execute a first PID algorithm and a second PID algorithm, the first PID algorithm executing the generating the first control signal and the second PID algorithm executing the generating the second control signal.

In some embodiments of the method, the controller unit comprises a first PID controller and a second PID controller, the first PID controller executing the generating the first control signal and the second PID controller executing the generating the second control signal.

In some embodiments of the method, the maintaining the flow of air from the first chamber to the second chamber comprises maintaining the air pressure of the first chamber to be above the air pressure of the second chamber.

In some embodiments of the method, in response to determining that the first differential pressure value is above the first target value, the first control signal comprises instructions for decreasing the inlet fan speed.

In some embodiments of the method, in response to determining that the first differential pressure value is below the first target value, the first control signal comprises instructions for increasing the inlet fan speed.

In some embodiments of the method, in response to determining that the second differential pressure value is below the second target value, the second control signal comprises instructions for decreasing the outlet fan speed.

In some embodiments of the method, in response to determining that the second differential pressure value is above the second target value, the second control signal comprises instructions for increasing the outlet fan speed.

In some embodiments of the method, controller unit is further coupled to a first damper fluidly coupling the outside area and the air inlet, the first damper configured to control the amount of air from the outside area to flow into the air inlet; a second damper fluidly coupling the second chamber and the air inlet, the second damper configured to control the amount of air from the second chamber to flow into the air inlet; a thermometer configured to measure a temperature value of the air entering the air inlet. The method further comprises: adjusting the air temperature value to a temperature target value by controlling the first and second dampers.

In some embodiments of the method, both the first differential pressure gauge and the second differential pressure gauge comprise a respective first inlet and a second inlet, the respective first inlets receiving the air pressure of the outside area; and wherein the respective first inlets are coupled to a single pressure point for sensing the air pressure of the outside area at a single location.

In some embodiments of the method, both the first differential pressure gauge and the second differential pressure gauge are implemented as at least one software routine executable by the controller unit, the controller unit being coupled to a first pressure gauge installed within the first chamber, a second pressure gauge installed within the second chamber, and a third pressure gauge installed within the outside area. Furthermore, receiving the first differential pressure value from the first differential pressure gauge comprises receiving the air pressures measured by the first and third pressure gauges; and calculating the first differential pressure value based on the air pressures measured by the first and third pressure gauges, and receiving the second differential pressure value from the second differential pressure gauge comprises receiving the air pressures measured by the second and third pressure gauges; and calculating the second differential pressure value based on the air pressures measured by the second and third pressure gauges.

In some embodiments of the method, the server room is a first server room, the server rack is a first server rack, the air inlet is a first air inlet, and the data center further comprises a second server room. The second server room comprises: a third chamber and a fourth chamber partitioned therebetween by a second server rack and being in fluid communication therebetween via the second server rack, the third chamber having a second air inlet fluidly coupled to the outside of the data center, and the fourth chamber being fluidly coupled to the second chamber.

In some embodiments of the method, the inlet fan is a first inlet fan, and the controller unit is further coupled to a second inlet fan configured to flow air from the outside area into the third chamber at different speeds via the second inlet and a third differential pressure gauge configured to measure a third differential pressure value of an air pressure of the third chamber relative to the air pressure of the outside area. The method further comprises receiving the third differential pressure value from the third differential pressure gauge; in response to the third differential pressure value not matching its third target value, generating a third control signal to adjust the speed of the second inlet fan; and transmitting the third control signal to the second inlet fan.

In some embodiments of the method, in response to determining that the third differential pressure value is above the third target value, the third control signal comprises instructions for decreasing the second inlet fan speed.

In some embodiments of the method, in response to determining that the third differential pressure value is below the third target value, the third control signal comprises instructions for increasing the second inlet fan speed.

In some embodiments of the method, the controller unit is further coupled to a first damper, a second damper, a fourth differential pressure gauge, and a fifth differential pressure gauge. The first damper partitions the second chamber into a first portion and a second portion fluidly coupled to the air outlet, and is configured to control the amount of air to flow from the first portion into the second portion. The second damper partitions the fourth chamber into a third portion and a fourth portion fluidly coupled to the air outlet, and is configured to control the amount of air to flow from the third portion into the fourth portion. The fourth differential pressure gauge is configured to measure a fourth differential pressure value of an air pressure of the first portion relative to the air pressure of the outside area. The fifth differential pressure gauge is configured to measure a fifth differential pressure value of an air pressure of the third portion relative to the air pressure of the outside area. The method further comprises: receiving the fourth differential pressure value from the fourth differential pressure gauge; receiving the fifth differential pressure value from the fifth differential pressure gauge; generating a fourth control signal to adjust the opening of the first damper based on the fourth differential pressure value; generating a fifth control signal to adjust the opening of the second damper based on the fifth differential pressure value; and transmitting the fourth and fifth control signals to the respective first and second dampers to adjust the fourth differential pressure value to a fourth target value, and adjust the fifth differential pressure value to a fifth target value, the fourth target value being below the first target value and above the second target value, the fifth target value being below the third target value and above the second target value.

In some embodiments of the method, in response to determining that the fourth differential pressure value is above the fourth target value, the fourth control signal comprising instructions for increasing an opening of the first damper; and in response to determining that the fifth differential pressure value is above the fifth target value, the fifth control signal comprising instructions for increasing an opening of the second damper.

In some embodiments of the method, in response to determining that the fourth differential pressure value is below the fourth target value, the fourth control signal comprising instructions for decreasing an opening of the first damper; and in response to determining that the fifth differential pressure value is below the fifth target value, the fifth control signal comprising instructions for decreasing an opening of the second damper.

In some embodiments of the method, the second differential pressure gauge is placed fluidly downstream of the second and fourth portions.

In some embodiments of the method, in response to determining that the second differential pressure value is below the second target value, the second control signal comprising instructions for decreasing the outlet fan speed.

In some embodiments of the method, in response to determining that the second differential pressure value is above the second target value, the second control signal comprising instructions for increasing the outlet fan speed.

In another broad aspect of the present technology, there is provided an air flow control system for cooling a data center comprising a server room, the server room comprises a first chamber and a second chamber partitioned therebetween by a server rack and being in fluid communication therebetween via the server rack, the first chamber having an air inlet fluidly coupled to an outside area of the server room, the second chamber having an air outlet fluidly coupled to the outside area, the system comprising an inlet fan configured to flow air from the outside area into the first chamber at different speeds, via the air inlet; an outlet fan configured to flow air from the second chamber into the outside area at different speeds, via the air outlet; a first differential pressure gauge configured to measure a first differential pressure value of an air pressure of the first chamber relative to an air pressure of the outside area; a second differential pressure gauge configured to measure a second differential pressure value of an air pressure of the second chamber relative to the air pressure of the outside area; a controller unit coupled to the inlet fan, the outlet fan, the first differential pressure gauge, and the second differential pressure gauge. The controller unit comprises a processor configured to: receive the first differential pressure value from the first differential pressure gauge; receive the second differential pressure value from the second differential pressure gauge; generate a first control signal to adjust the speed of the inlet fan based on the first differential pressure value; generate a second control signal to adjust the speed of the outlet fan based on the second differential pressure value; transmit the first and second control signals to the respective inlet and outlet fans to adjust the first differential pressure value to a first target value, and adjust the second differential pressure value to a second target value, the first target value being above the second target value, thereby maintaining a flow of air from the first chamber to the second chamber.

In some embodiments of the system, the processor executes the generating of the first control signal independently from the generating of the second control signal.

In some embodiments of the system, the processor is configured to execute a first PID algorithm to generate the first control signal, and a second PID algorithm to generate the second control signal.

In some embodiments of the system, the controller unit comprises a first PID controller and a second PID controller, the first PID controller configured to generate the first control signal and the second PID configured to generate the second control signal.

In some embodiments of the system, maintaining the flow of air from the first chamber to the second chamber comprises maintaining the air pressure of the first chamber to be above the air pressure of the second chamber.

In some embodiments of the system, the processor is configured to generate the first control signal comprising instructions for decreasing the inlet fan speed in response to determining that the first differential pressure value is above the first target value.

In some embodiments of the system, the processor is configured to generate the first control signal comprising instructions for increasing the inlet fan speed in response to determining that the first differential pressure value is below the first target value.

In some embodiments of the system, the processor is configured to generate the second control signal comprising instructions for decreasing the outlet fan speed in response to determining that the second differential pressure value is below the second target value.

In some embodiments of the system, the processor is configured to generate the second control signal comprising instructions for increasing the outlet fan speed response to determining that the second differential pressure value is above the second target value.

In some embodiments of the system, the controller unit is further coupled to a first damper fluidly coupling the outside area and the air inlet, the first damper configured to control the amount of air from the outside area to flow into the air inlet; a second damper fluidly coupling the second chamber and the air inlet, the second damper configured to control the amount of air from the second chamber to flow into the air inlet; a thermometer configured to measure a temperature value of the air entering the air inlet; and the processor is further configured to adjust the air temperature value to a temperature target value by controlling the first and second dampers.

In some embodiments of the system, both the first differential pressure gauge and the second differential pressure gauge comprise a respective first inlet and a second inlet, the respective first inlets receiving the air pressure of the outside area; and wherein the respective first inlets are coupled to a single pressure point for sensing the air pressure of the outside area at a single location.

In some embodiments of the system, both the first differential pressure gauge and the second differential pressure gauge are implemented as at least one software routine executable by the controller unit, the controller unit being coupled to a first pressure gauge installed within the first chamber, a second pressure gauge installed within the second chamber, and a third pressure gauge installed within the outside area. To receive the first differential pressure value from the first differential pressure gauge, the processor is configured to: receive the air pressures measured by the first and third pressure gauges; and calculate the first differential pressure value based on the air pressures measured by the first and third pressure gauges; and to receive the second differential pressure value from the second differential pressure gauge, the processor is configured to: receive the air pressures measured by the second and third pressure gauges; and calculate the second differential pressure value based on the air pressures measured by the second and third pressure gauges.

In some embodiments of the system, the server room is a first server room, the server rack is a first server rack, the air inlet is a first air inlet, and the data center further comprises a second server room. The second server room comprises: a third chamber and a fourth chamber partitioned therebetween by a second server rack and being in fluid communication therebetween via the second server rack, the third chamber having a second air inlet fluidly coupled to the outside of the data center, and the fourth chamber being fluidly coupled to the second chamber.

In some embodiments of the system, the inlet fan is a first inlet fan, and the processor is further coupled to a second inlet fan configured to flow air from the outside area into the third chamber at different speeds via the second inlet and a third differential pressure gauge configured to measure a third differential pressure value of an air pressure of the third chamber relative to the air pressure of the outside area. The processor is further configured to receive the third differential pressure value from the third differential pressure gauge; in response to the third differential pressure value not matching its third target value, generate a third control signal to adjust the speed of the second inlet fan; and transmit the third control signal to the second inlet fan.

In some embodiments of the system, in response to determining that the third differential pressure value is above the third target value, the third control signal comprises instructions for decreasing the second inlet fan speed.

In some embodiments of the system, in response to determining that the third differential pressure value is below the third target value, the third control signal comprises instructions for increasing the second inlet fan speed.

In some embodiments of the system, the processor is further coupled to a first damper, a second damper, a fourth differential pressure gauge, and a fifth differential pressure gauge. The first damper partitions the second chamber into a first portion and a second portion fluidly coupled to the air outlet, and is configured to control the amount of air to flow from the first portion into the second portion. The second damper partitions the fourth chamber into a third portion and a fourth portion fluidly coupled to the air outlet, and is configured to control the amount of air to flow from the third portion into the fourth portion. The fourth differential pressure gauge is configured to measure a fourth differential pressure value of an air pressure of the first portion relative to the air pressure of the outside area. The fifth differential pressure gauge is configured to measure a fifth differential pressure value of an air pressure of the third portion relative to the air pressure of the outside area. The processor is further configured to: receive the fourth differential pressure value from the fourth differential pressure gauge; receive the fifth differential pressure value from the fifth differential pressure gauge; generating a fourth control signal to adjust the opening of the first damper based on the fourth differential pressure value; generate a fifth control signal to adjust the opening of the second damper based on the fifth differential pressure value; and transmit the fourth and fifth control signals to the respective first and second dampers to adjust the fourth differential pressure value to a fourth target value, and adjust the fifth differential pressure value to a fifth target value, the fourth target value being below the first target value and above the second target value, the fifth target value being below the third target value and above the second target value.

In some embodiments of the system, in response to determining that the fourth differential pressure value is above the fourth target value, the fourth control signal comprises instructions for increasing an opening of the first damper; and in response to determining that the fifth differential pressure value is above the fifth target value, the fifth control signal comprises instructions for increasing an opening of the second damper.

In some embodiments of the system, in response to determining that the fourth differential pressure value is below the fourth target value, the fourth control signal comprises instructions for decreasing an opening of the first damper; and in response to determining that the fifth differential pressure value is below the fifth target value, the fifth control signal comprises instructions for decreasing an opening of the second damper.

In some embodiments of the system, the second differential pressure gauge is placed fluidly downstream of the second and fourth portions.

In some embodiments of the system, in response to determining that the second differential pressure value is below the second target value, the second control signal comprises instructions for decreasing the outlet fan speed.

In some embodiments of the system, in response to determining that the second differential pressure value is above the second target value, the second control signal comprises instructions for increasing the outlet fan speed.

In a further broad aspect of the present technology, there is provided an air flow control method for cooling a data center comprising a server room. The server room comprises a first chamber and a second chamber partitioned therebetween by a server rack and being in fluid communication therebetween via the server rack. The first chamber has an air inlet fluidly coupled to an outside area of the server room, and the second chamber has an air outlet fluidly coupled to the outside area. The method is executable by a controller unit coupled to an inlet fan configured to flow air from the outside area into the first chamber at different speeds, via the air inlet; an outlet fan configured to flow air from the second chamber into the outside area at different speeds, via the air outlet; a first differential pressure gauge configured to measure a first differential pressure value of an air pressure of the first chamber relative to an air pressure of the outside area; a second differential pressure gauge configured to measure a second differential pressure value of an air pressure of the second chamber relative to the air pressure of the outside area. The method comprises: receiving the first differential pressure value from the first differential pressure gauge; comparing the first differential pressure value to a first target value; upon determining that the first differential pressure value is different from the first target value, generating a first control signal to adjust the speed of the inlet fan; transmitting the first control signal to the inlet fan to adjust the first differential pressure value to the first target value; receiving the second differential pressure value from the second differential pressure gauge; comparing the second differential pressure value, the second target value being below the first target value; upon determining that the second differential pressure value is different from the second target value, generating a second control signal to adjust the speed of the outlet fan; and transmitting the second control signal to the outlet fan to adjust the second differential pressure to the second target value.

In a further broad aspect of the present technology, there is provided an air flow control method for cooling a data center comprising a server room. The server room comprises a first chamber and a second chamber partitioned therebetween by a server rack and being in fluid communication therebetween via the server rack. The first chamber has an air inlet fluidly coupled to an outside area of the server room, and the second chamber has an air outlet fluidly coupled to the outside area. The method is executable by a controller unit coupled to an inlet fan configured to flow air from the outside area into the first chamber at different speeds, via the air inlet; an outlet fan configured to flow air from the second chamber into the outside area at different speeds, via the air outlet; a first differential pressure gauge configured to measure a first differential pressure value of an air pressure of the first chamber relative to an air pressure of the outside area; a second differential pressure gauge configured to measure a second differential pressure value of an air pressure of the second chamber relative to the air pressure of the outside area. The method comprises: receiving the first differential pressure value from the first differential pressure gauge; receiving the second differential pressure value from the second differential pressure gauge; in response to one of the first differential pressure value and the second differential pressure value not matching its respective first and second target values, generating a control signal to adjust the speed of an associated one of the inlet fan and the outlet fan; and transmitting the control signal to the associated one of the inlet fan and the outlet fan.

DESCRIPTION OF THE DRAWINGS

For a better understanding of the present technology, as well as other aspects and further features thereof, reference is made to the following description which is to be used in conjunction with the accompanying drawings, where.

DETAILED DESCRIPTION

Figure 1:
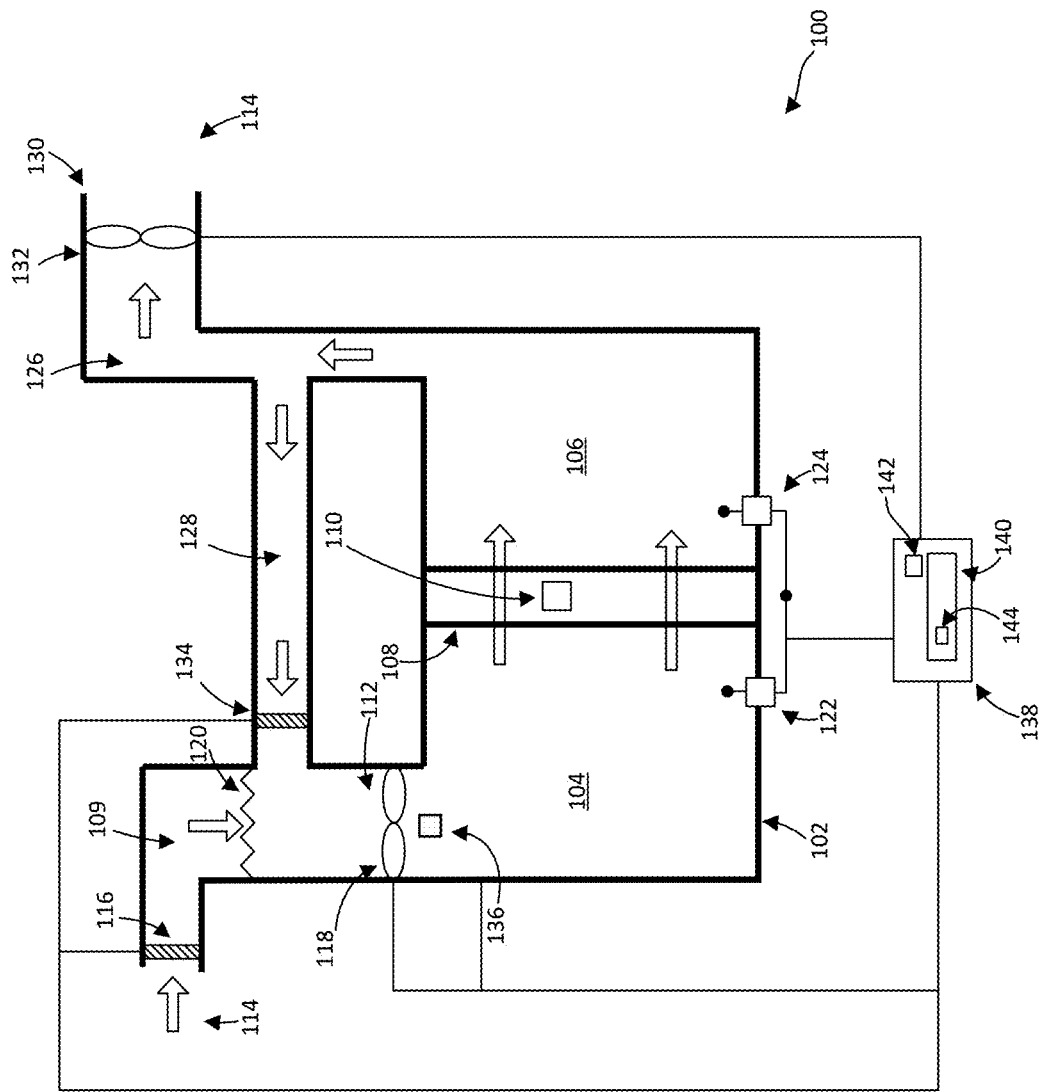
FIG. 1 is a schematic diagram depicting a system according to a first embodiment, the system being implemented in accordance with non-limiting embodiments of the present technology.

Referring to FIG. 1, there is shown a schematic diagram of a system 100, the system 100 being suitable for implementing non-limiting embodiments of the present technology. It is to be expressly understood that the system 100 is depicted merely as an illustrative implementation of the present technology. Thus, the description thereof that follows is intended to be only a description of illustrative examples of the present technology. This description is not intended to define the scope or set forth the bounds of the present technology. In some cases, what are believed to be helpful examples of modifications to the system 100 may also be set forth below. This is done merely as an aid to understanding, and, again, not to define the scope or set forth the bounds of the present technology. These modifications are not an exhaustive list, and as a person skilled in the art would understand, other modifications are likely possible. Further, where this has not been done (i.e. where no examples of modifications have been set forth), it should not be interpreted that no modifications are possible and/or that what is described is the sole manner of implementing that element of the present technology. As a person skilled in the art would understand, this is likely not the case. In addition, it is to be understood that the system 100 may provide in certain instances simple implementations of the present technology, and that where such is the case they have been presented in this manner as an aid to understanding. As persons skilled in the art would understand, various implementations of the present technology may be of a greater complexity.

The examples and conditional language recited herein are principally intended to aid the reader in understanding the principles of the present technology and not to limit its scope to such specifically recited examples and conditions. It will be appreciated that those skilled in the art may devise various arrangements which, although not explicitly described or shown herein, nonetheless embody the principles of the present technology and are included within its spirit and scope. Furthermore, as an aid to understanding, the following description may describe relatively simplified implementations of the present technology. As persons skilled in the art would understand, various implementations of the present technology may be of greater complexity.

Moreover, all statements herein reciting principles, aspects, and implementations of the present technology, as well as specific examples thereof, are intended to encompass both structural and functional equivalents thereof, whether they are currently known or developed in the future. Thus, for example, it will be appreciated by those skilled in the art that any block diagrams herein represent conceptual views of illustrative circuitry embodying the principles of the present technology. Similarly, it will be appreciated that any flowcharts, flow diagrams, state transition diagrams, pseudo-code, and the like represent various processes which may be substantially represented in computer-readable media and so executed by a computer or processor, whether or not such computer or processor is explicitly shown.

The functions of the various elements shown in the figures, including any functional block labeled as a "processor" may be provided through the use of dedicated hardware as well as hardware capable of executing software in association with appropriate software. When provided by a processor, the functions may be provided by a single dedicated processor, by a single shared processor, or by a plurality of individual processors, some of which may be shared. In some embodiments of the present technology, the processor may be a general purpose processor, such as a central processing unit (CPU) or a processor dedicated to a specific purpose, such as a graphics processing unit (GPU). Moreover, explicit use of the term "processor" or "controller" should not be construed to refer exclusively to hardware capable of executing software, and may implicitly include, without limitation, digital signal processor (DSP) hardware, network processor, application specific integrated circuit (ASIC), field programmable gate array (FPGA), read-only memory (ROM) for storing software, random access memory (RAM), and non-volatile storage. Other hardware, conventional and/or custom, may also be included.

With these fundamentals in place, we will now consider some non-limiting examples to illustrate various implementations of aspects of the present technology.

The system 100 is configured to control the air flow for cooling a server room 102, of a data center or the like. The server room 102 is partitioned by a server rack 108 into a cold chamber 104 (which can also be thought of as a "first chamber"), and a hot chamber 106 (which can also be thought as a "second chamber"). The server rack 108 is configured to house one or more servers 110. The manner in which the one or more servers 110 are housed within the server rack 108 is not limited, and may for example be in a "chassis" configuration. Although in the illustrated embodiment only one server rack 108 is shown, it is not limitative. As such, it is contemplated that the server room 102 is partitioned, by a plurality of server racks organized in rows or back-to-back, into the cold chamber 104 and the hot chamber 106.

As has been alluded above, each of the servers 110 housed within the server rack 108 generally comprise a fan, which is configured to draw cool air from the cold chamber 104 through an inlet of the server, allow it to circulate within the servers 110 and exhaust the heated air into the hot chamber 106. Thus, heat generated within the one or more servers 110 is cooled by the cold air sucked thereinto, and the one or more servers 110 can operate normally.

In some embodiments, the server rack 108 may include one or more large "rack fans" located behind the servers (not shown) within the server rack 108. These "rack fans" are also configured to draw cool air from the cold chamber 104 into the plurality of servers (not shown) and exhaust the heated air into the hot chamber 106.

The system 100 includes a first channel 109 coupling an air inlet 112 of the cold chamber 104 to an ambient outside 114, thereby allowing the air from the ambient outside 114 to flow into the cold chamber 104. In some embodiments, the server room 102 is housed within a building (such as a hangar and the like) (not depicted), and the ambient outside 114 is an area outside the server room 102. As such, the ambient outside 114 may refer to, for example, the area surrounding the building, or the area surrounding the server room 102 within the building.

The amount of air from the ambient outside 114 flowing into the cold chamber 104 is controlled by two means. Firstly, a first damper 116 is installed near one end of the first channel 109, which is configured to adjust, by a degree of opening thereof, an amount of air that flows into the first channel 109. Secondly, an inlet fan 118 provided nearby or within the air inlet 112 is configured to flow the air within the first channel 109 into the cold chamber 104.

The manner in which the inlet fan 118 is implemented is not limited. By way of example, the inlet fan 118 may be implemented as an axial-flow fan, a centrifugal fan, or a cross-flow fan, and the like. In some embodiments, the inlet fan 118 is configured to increase and/or decrease the flow of air into the cold chamber 104 by, for example increasing or decreasing the speed of rotation (discussed in detail below). As will be described in greater detail herein below, the inlet fan 118 is configured to be controlled by a machine controller. As such, the amount of air entering the cold chamber 104 by the inlet fan 118 (as well as other operational parameters thereof) can be controlled by the machine controller.

Although in the depicted non-limiting embodiment of the present technology, there is only one inlet fan 118 shown, it is not limited as such and, there may be a plurality of inlet fan 118. In a specific non-limiting example, the inlet fan 118 is implemented as a fan manufactured by the EBM-Papst Group of Mulfingen, Germany, under model designation EBMpapst-4312, EBMpapst-8412.

In some embodiments, there is provided a filter 120 installed before the inlet fan 118 which prevents dust carried by the air from the ambient outside 114 from entering the cold chamber 104. Needless to say, although in the depicted non-limiting embodiment of the present technology, the filter 120 is shown to be placed fluidly upstream from the inlet fan 118, it is not limited as such, and may be placed fluidly downstream from the inlet fan 118.

The system 100 comprises a first differential pressure gauge 122 configured to measure a first differential pressure value corresponding to a difference of air pressure of the cold chamber 104 relative to the air pressure of the ambient outside 114.

The manner in which the first differential pressure gauge 122 is implemented is known and therefore will not be described at length herein. Suffice to say that the first differential pressure gauge 122 has a first and second inlet ports (not shown) that are each connected to a respective pressure point being monitored. Just as an example, the first inlet port may be connected to a first pressure point within the cold chamber 104, and the second inlet port may be connected, for example, to a second pressure point outside the building housing the system 100 (i.e. within the ambient outside 114), or vice-versa. In a specific non-limiting example, the first differential pressure gauge 122 is implemented as one of the differential pressure gauges manufactured by Dwyer Instruments Inc. of Michigan, USA, under model designation DH Digihelic®.

The hot chamber 106 comprises, and is in fluid communication with, a second channel 126 and a third channel 128. There is provided an air outlet 130 at the end of the second channel 126 which is open to the ambient outside 114 for exhausting the heated air within the hot chamber 106. Nearby the air outlet 130, an outlet fan 132 is installed, which is configured to flow the heated air from the hot chamber 106 to the ambient outside 114. The manner in which the outlet fan 132 is implemented is not limited, and may be implemented similarly to the inlet fan 118 explained above.

The third channel 128 fluidly couples the hot chamber 106 to the first channel 109. In some embodiments, a second damper 134 is installed within the third channel 128 which is configured to adjust, by a degree of opening thereof, an amount of heated air from the hot chamber 106 to flow into the first channel 109 together with the ambient air entering from the first damper 116.

In some embodiments, the filter 120 is placed fluidly upstream of the first channel 109 before communicating with the third channel 128, thereby avoiding the filtering of the heated air and maintaining the speed of the heated air entering the cold chamber 104.

In some embodiment of the present technology, the temperature of the cold chamber 104 is captured by a thermometer 136 installed within the cold chamber 104. In some embodiments, the thermometer 136 is placed in proximity to the inlet fan 118 within the cold chamber 104, hanging from a ceiling thereof, to obtain a precise temperature value of the air entering the cold chamber 104.

Similar to the cold chamber 104, a second differential pressure gauge 124 is installed within the hot chamber 106, which is configured to measure a second differential pressure value corresponding to a difference of air pressure of the hot chamber 106 relative to the air pressure of the ambient outside 114. The manner in which the second differential pressure gauge 124 is implemented is not limited, and may for example be implemented in a similar manner to the first differential pressure gauge 122.

In some embodiments, the pressure point of the ambient outside 114 for the second differential pressure gauge 124 is the same as the first differential pressure gauge 122. In other words, the first differential pressure gauge 122 and the second differential pressure gauge 124 share the same pressure point for the ambient outside 114 at one location. A special technical effect attributable to these specific embodiments is the avoidance of variations of readings of the ambient pressure between the first differential pressure gauge 122 and the second differential pressure gauge 124.

The system 100 further comprises a controller unit 138 for controlling the air flow for cooling the server room 102. In some embodiments, the controller unit 138 is a computer configured to receive and transmit signals from various devices (described in more detail below). The controller unit 138 comprises a memory 140 which comprises one or more storage media and generally provides a place to store computer-executable program instructions executable by a processor 142. By way of example, the memory 140 may be implemented as tangible computer-readable storage medium including Read-Only Memory (ROM) and/or Random-Access Memory (RAM). The memory 140 may also include one or more fixed storage devices in the form of, by way of example, hard disk drives (HDDs), solid-state drives (SSDs), and flash-memory cards.

Controlling the air flow for cooling the server room 102 is executed by an application 144 stored within the memory 140. As described below in more detail, the application 144 comprises a set of computer executable program instructions executable by the processor 142.

Figure 2:
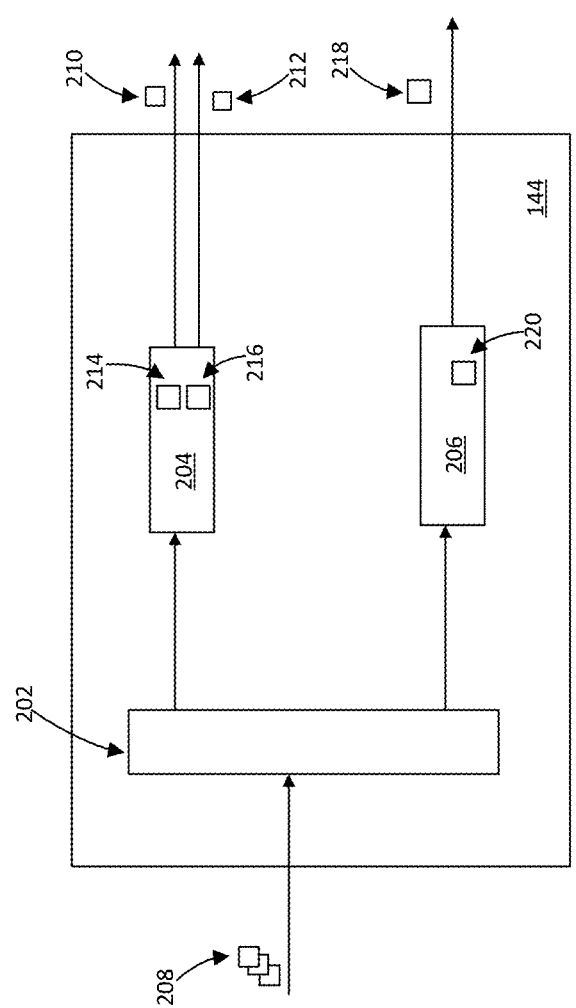
FIG. 2 depicts an example of a process of generating the first, second and third control signal by the controller unit of the system of FIG. 1.

Functions and operations of the various components of the application 144 will now be described in greater details. With reference to FIG. 2, there is depicted a schematic illustration of the application 144 for controlling the air flow between the cold chamber 104 and the hot chamber 106. The application 144 executes (or otherwise has access to): a measurement value acquisition routine 202, a fan control routine 204, and a damper control routine 206.

In the context of the present specification, the term "routine" refers to a subset of the computer executable program instructions of the application 144 that is executable by the processor 142 to perform the functions explained below. For the avoidance of any doubt, it should be expressly understood that the measurement value acquisition routine 202, the fan control routine 204, and the damper control routine 206 are illustrated schematically herein in a separate and distributed manner for ease of explanation of the processes executed by the application 144. It is contemplated that some or all of the measurement value acquisition routine 202, the fan control routine 204, and the damper control routine 206 may be implemented as one or more combined routines.

Functionalities of each one of the measurement value acquisition routine 202, the fan control routine 204, and the damper control routine 206, as well as data and/or information processed or stored therein are described below.

Receiving the Data

Each of the thermometer 136, the first differential pressure gauge 122 and the second differential pressure gauge 124 transmit sensed data to the controller unit 138 by virtue of data packets 208 transmitted to the controller unit 138. The data packets 208 include a respective data packet for each of the monitored measurements, and thus includes at least one data packet comprising a temperature value sensed by the thermometer 136, at least one data packet comprising the first differential pressure value sensed by the first differential pressure gauge 122, and at least one data packet comprising the second differential pressure value sensed by the second differential pressure gauge 124.

Although the first differential pressure gauge 122 and the second differential pressure gauge 124 have been depicted as hardware within FIG. 1, it is to be understood that it is not limited as such. Indeed, it is contemplated that the first differential pressure gauge 122 and/or the second differential pressure gauge 124 may be implemented as at least one software routine that is part of the measurement value acquisition routine 202 and configured to receive, via the data packets 208, the measured air pressures from their respective first and second pressure points (implemented as pressure gauges), and calculate the first differential pressure value and second differential pressure value. In a specific non-limiting example, the pressure gauges are implemented as a pressure gauge manufactured by Dwyer Instruments Inc. of Michigan, USA, under model designation DPG-200.

Controlling the Fan Speed

Based on the data packets 208 received by the measurement value acquisition routine 202, the fan control routine 204 generates a first control signal 210 for controlling the rotation speed of the inlet fan 118 and a second control signal 212 for controlling the rotation speed of the outlet fan 132.

The manner in which the first control signal 210 is generated is now explained. In some embodiments, the fan control routine 204 comprises a first proportional-integral-derivative (PID) algorithm 214. The first PID algorithm 214 is configured to compare the first differential pressure value (determined by the first differential pressure gauge 122) to a first target value (described below). The fan control routine 204 generates and transmits the first control signal 210 which contains instructions for adjusting the rotation speed of the inlet fan 118 in order to achieve the first target value.

In some embodiments of the present technology, the first target value is indicative of the target differential pressure value to be maintained within the cold chamber 104 in relation to the ambient outside 114. In some embodiments, the first target value is 15 Pa (meaning that the pressure within the cold chamber 104 is 15 Pa above the pressure of the ambient outside 114). Needless to say, it is further contemplated that the first target value may be a different value. It is also contemplated that the controller unit 138 comprises, or is electrically coupled to, an input device (not shown) for receiving the first target value by a user.

In some embodiments, if it is determined that the first differential pressure value is below the first target value (for example, the first differential pressure value is indicative of 14 Pa, meaning that the pressure of the cold chamber 104 is 14 Pa above the pressure of the ambient outside 114), the first control signal 210 contains instructions to increase the rotation speed of the inlet fan 118 in order to increase amount of air entering the cold chamber 104, thereby increasing the pressure within the cold chamber 104 to achieve the first target value.

Alternatively, in some embodiments, if it is determined that the first differential pressure value is above the first target value (for example, the first differential pressure value is indicative of 16 Pa, meaning that the pressure of the cold chamber 104 is 16 Pa above the pressure of the ambient outside), the first control signal 210 contains instructions to decrease the rotation speed of the inlet fan 118 in order to decrease the amount of air entering the cold chamber 104, thereby decreasing the pressure within the cold chamber 104 to achieve the first target value.

In some embodiments, if it is determined that the first differential pressure value matches the first target value, the fan control routine 204 does not generate the first control signal 210. Alternatively, the fan control routine 204 may also be configured to generate the first control signal 210, which contains instructions to maintain the rotation speed of the inlet fan 118, upon determining that the first differential pressure value matches the first target value.

The manner in which the second control signal 212 is generated is now explained. In some embodiments, the fan control routine 204 comprises a second PID algorithm 216 (in addition to the first PID algorithm 214). The second PID algorithm 216 is configured to compare the second differential pressure value (determined by the second differential pressure gauge 124) to a second target value. The fan control routine 204 generates and transmits the second control signal 212 which contains instructions for adjusting the rotation speed of the outlet fan 132 in order to achieve the second target value.

In some embodiments of the present technology, the second target value is indicative of the target differential pressure value to be maintained within the hot chamber 106 in relation to the ambient outside 114. In some embodiments, the second target value is 0 Pa (meaning there is equilibrium between the pressure in the hot chamber 106 and the ambient outside 114). Needless to say, it is further contemplated that the second target value may be a different value. It is also contemplated that the second target value is inputted from the user via the input device (not shown).

In some embodiments, if it is determined that the second differential pressure value is below the second target value (for example, the second differential pressure value is indicative of −1 Pa, meaning that the pressure of the hot chamber 106 is 1 Pa below the pressure of the ambient outside 114), the second control signal 212 contains instructions to decrease the rotation speed of the outlet fan 132 in order to decrease the amount of heated air exiting the hot chamber 106, thereby increasing the air pressure within the hot chamber 106 to achieve the second target value.

Alternatively, in some embodiments, if it is determined that the second differential pressure value is above the second target value (for example, the second differential pressure value is indicative of 1 Pa, meaning that the pressure of the hot chamber 106 is 1 Pa above the pressure of the ambient outside 114), the second control signal 212 contains instructions to increase the rotation speed of the outlet fan 132 in order to increase the amount of heated air existing the hot chamber 106, thereby decreasing the air pressure within the hot chamber 106 to achieve the second target value.

In some embodiments, if it is determined that the second differential pressure value matches the second target value, the fan control routine 204 does not generate the second control signal 212. Alternatively, the fan control routine 204 may also be configured to generate the second control signal 212, which contains instructions to maintain the rotation speed of the outlet fan 132, upon determining that the second differential pressure value matches the second target value.

In some embodiments, the first target value is above the second target value. In other words, the air pressure within the cold chamber 104 is above the air pressure within the hot chamber 106. As such, air from the hot chamber 106 is prevented from flowing into the cold chamber 104, and a required air flow from the cold chamber 104 into the hot chamber 106 is ensured.

In yet another embodiment, the first target value is above the second target value, and the second target value is set to maintain a higher air pressure within the hot chamber 106 relative to the air pressure within the ambient outside 114. In other words, the air pressure within the cold chamber 104 is above the air pressure within the hot chamber 106, which is above the air pressure of the ambient outside. In this configuration, dust (if present) within the hot chamber 106 is carried over to the ambient outside 114.

As it is apparent from the above description, the controller unit 138 generates the first control signal 210 independently from the second control signal 212. In other words, it can be said that the controller unit 138 independently controls operation of the inlet fan 118 and outlet fan 132. Therefore, broadly speaking, the controller unit 138 is configured to determine the difference between the (i) the first differential pressure value to the first target value; (ii) the second differential pressure value to the second target value, and to selectively adjust the speed of the associated inlet fan 118 and outlet fan 132 based on the so-determined difference. In other words, the controller unit 138 is configured to selectively control one of the inlet fan 118 and the outlet fan 132 based on determined mis-alignment between the associated (i) first differential pressure value and the first target value and (ii) second differential pressure value and the second target value.

This is based on a few observations made by the developers. For example, developers observed that by only selectively controlling the speed of the inlet fan 118 and outlet fan 132 based on the monitored first and second differential pressure values, the solution presented by the present technology may achieve a better air flow for cooling the server room 102 and be less expensive in terms of computing resources and energy when compared to the prior art solutions, as embodiments of the present technology disclosed herein require processing less data compared to the prior art approaches.

Needless to say, although the first control signal 210 and the second control signal 212 have been described as being generated by the processor 142 executing the application 144, it is not limited as such. In some embodiments of the present technology, the controller unit 138 comprises a first PID controller (not depicted) and a second PID controller (not depicted), which are configured to generate the first control signal 210 and second control signal 212, respectively, in a manner similarly described above. Put another way, the independent control of the inlet fan 118 and outlet fan 132 can be implemented using one or more controllers implementing one or more PID control routines, which PID control routine can be implemented either in hardware, software or a combination thereof.

Controlling the Temperature

Based on the data packets 208 received by the measurement value acquisition routine 202, the damper control routine 206 generates a third control signal 218 for adjusting the opening of at least one of the first damper 116 and second damper 134.

The manner in which the third control signal 218 is generated is now explained. In some embodiments, the damper control routine 206 comprises a third PID algorithm 220. The third PID algorithm 220 is configured to compare the temperature value sensed by the thermometer 136 to a temperature target value. The damper control routine 206 generates and transmits the third control signal 218 which contains instructions for adjusting the openings of the first and/or second dampers 116, 134 in order to achieve the temperature target value.

In some embodiments of the present technology, the temperature target value is indicative of a target temperature to be maintained within the cold chamber 104. In some embodiments, the temperature target value is or about 20 degree Celsius. Needless to say, it is further contemplated that the temperature target value may be a different value. It is also contemplated that the temperature target value is inputted from the user via the input device (not shown).

In some embodiments, if it is determined that the temperature value is below the temperature target value, the third control signal 218 contains at least one instruction of (i) increasing the opening of the second damper 134 so as to increase the amount of heated air from the hot chamber 106 to be "recycled" or directed into the cold chamber 104, and/or (ii) decrease the opening of the first damper 116 so as to decrease the amount of air from the ambient outside 114 directed into the cold chamber 104, so as to achieve the temperature target value.

Alternatively, in some embodiments, if it is determined that the temperature value is above the temperature target value, the third control signal 218 contains at least one instruction of (i) increasing the opening of the first damper 116 so as to increase the amount of air from the ambient outside 114 directed into the cold chamber 104, and/or (ii) decrease the opening of the second damper 134 so as to decrease the amount heated air from the hot chamber 106 to be directed into the cold chamber 104, so as to achieve the temperature target value.

As it is apparent from the above description, the present technology controls the temperature of the cold chamber 104 by selectively controlling the amount of ambient air (from the ambient outside 114) and the heated air (from the hot chamber 106) entering therein. As such, the use of certain devices, such as a cooling device (not depicted), is avoided, resulting in a more computationally economic solution.

Needless to say, the present technology is based on the premise that the ambient outside 114 will have a temperature generally lower than the temperature target value. This occurs for example, when the building housing the server room 102 is placed in a cold environment. Needless to say, if the building housing the server room 102 is situated in a place where the temperature of the ambient outside is generally higher than the temperature target value, a cooling device could be added within the first channel 109 so as to achieve the temperature target value.

Figure 3:
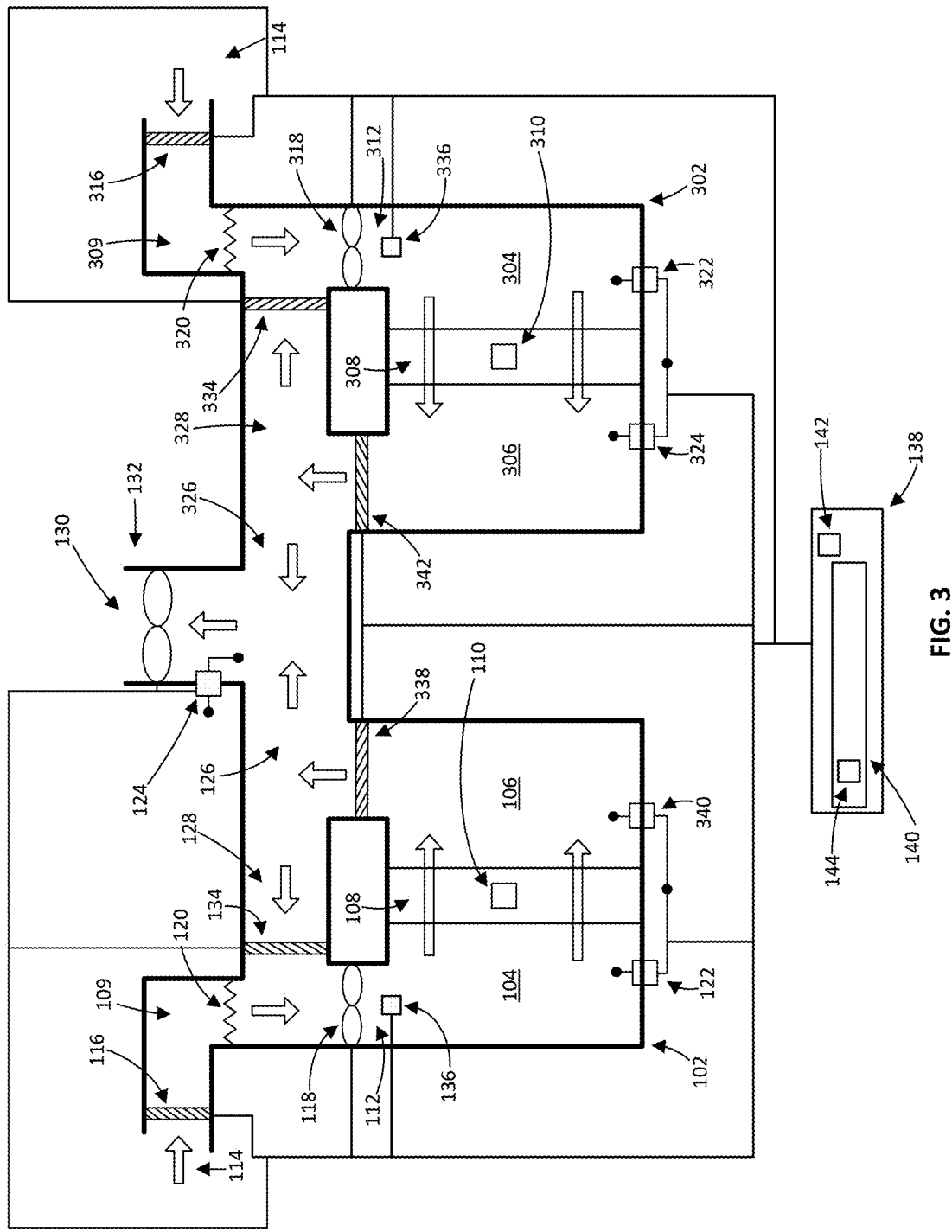
FIG. 3 is a schematic diagram depicting a system according to a second embodiment, the system being implemented in accordance with non-limiting embodiments of the present technology.

Turning now to FIG. 3, there is shown a schematic diagram of a system 300 which is a different implementation from the system 100 described above. Namely, the system 300 is configured to control the air flow for cooling a data center comprising two server rooms, namely the server room 102 (hereinafter referred to as a "first server room 102") and a server room 302 (hereinafter referred to as a "second server room 302"). For simplicity, elements of the first server room 102 described in the system 100 that are similar to those of the system 300 have been labelled with the same reference numerals and will not be described again in detail herein.

In this embodiment, the first server room 102 is in fluid communication with the second server room 302. More precisely, the hot chamber 106 is partitioned by a first chamber damper 338 (described below) into (i) a first portion defined between the first chamber damper 338 and the server rack 108, and (ii) a second portion comprising the second channel 126 and the third channel 128, which is in fluid communication with the second server room 302.

Furthermore, in this embodiment, the second differential pressure gauge 124 is placed in the second portion, fluidly downstream of the second channel 126, near the outlet fan 132. In other words, the second differential pressure gauge 124 is configured to measure the second differential pressure value corresponding to the difference of air pressure near the air outlet 130 to the air pressure of the ambient outside 114.

In some embodiments, a third differential pressure gauge 340 is placed within the first portion of the hot chamber 106. The third differential pressure gauge 340 is configured to measure a third differential pressure value corresponding to a difference of air pressure of the first portion of the hot chamber 106 relative to the air pressure of the ambient outside 114. The manner in which the third differential pressure gauge 340 is implemented is not limited and may for example be implemented in a similar manner to the first differential pressure gauge 122 and/or the second differential pressure gauge 124.

In some embodiments, the first chamber damper 338 is configured to adjust, by a degree of opening thereof, an amount of heated air from the first portion of the hot chamber 106 to flow into the second portion of the hot chamber 106.

Turning now to the second server room 302, the second server room 302 is partitioned by a server rack 308 into a cold chamber 304 and a hot chamber 306. The manner in which the server rack 308 is configured is not limited and for example be implemented in a similar manner to the server rack 108 of the first server room 102.

The system 300 includes a first channel 309 coupling an air inlet 312 of the cold chamber 304 to the ambient outside 314, thereby allowing the air from the ambient outside 114 to flow into the cold chamber 304.

Similar to the first server room 102, the amount of air from the ambient outside 114 flowing into the cold chamber 304 is controlled by two means. Firstly, a first damper 316 is installed near one end of the first channel 309 which is configured to adjust, by a degree of opening thereof, an amount of air that flows into the first channel 309. Secondly an inlet fan 318 provided nearby or within the air inlet 312 is configured to flow the air within the first channel 309 into the cold chamber 304.

The manner in which the inlet fan 318 is implemented is not limited and may for example be implemented in a similar manner to the inlet fan 118.

In some embodiments, the second server room 302 also comprises a filter 320 which prevents dust carried by the air from the ambient outside 114 from entering the cold chamber 304. The location in which the filter 320 is installed is not limited and may for example be installed in a similar manner to the filter 120.

The second server room 302 comprises a fourth differential pressure gauge 322 configured to measure a fourth differential pressure value corresponding to a difference of air pressure of the cold chamber 304 relative to the air pressure of the ambient outside. The manner in which the fourth differential pressure gauge 322 is implemented is not limited, and may for example be implemented in a similar manner to the first differential pressure gauge 122 and/or the second differential pressure gauge 124.

The hot chamber 306 is partitioned by a second chamber damper 342 (described below) into (i) a third portion defined between the second chamber damper 342 and the server rack 308, and (ii) a fourth portion comprising a first channel 328 and a second channel 326, which is in fluid communication with the first server room 102, via the second channel 126 of the hot chamber 106.

In some embodiments, the second chamber damper 342 is configured to adjust, by a degree of opening thereof, an amount of heated air from the first portion of the hot chamber 306 to flow into the second portion of the hot chamber 306.

Fluidly downstream of the second channel 126 and the second channel 326, there is provided the air outlet 130 which is open to the ambient outside 114 for exhausting the heated air within the hot chamber 106 and hot chamber 306.

The outlet fan 132 is installed nearby the air outlet 130, and is configured to flow the heated air near the air outlet 130 received from the second channel 126 and the second channel 326 to the ambient outside 114.

The first channel 328 fluidly couples the hot chamber 306 to the first channel 309. In some embodiments, a second damper 334 is installed within the first channel 328 which is configured to adjust, by a degree of opening thereof, an amount of heated air from the hot chamber 306 to flow into the first channel 309 together with the ambient air entering from the first damper 316.

In some embodiments, the temperature of the cold chamber 304 is captured by a thermometer 336 installed within the cold chamber 304. In some embodiments, the thermometer 336 is placed in proximity to the inlet fan 318 within the cold chamber 304, hanging from a ceiling thereof, to obtain a precise temperature value of the air entering the cold chamber 304.

Similar to the cold chamber 304, a fifth differential pressure gauge 324 is installed within the hot chamber 306, which is configured to measure a fifth differential pressure value corresponding to a difference of air pressure of the first portion of the hot chamber 306 relative to the air pressure of the ambient outside 114. The manner in which the fifth differential pressure gauge 324 is implemented is not limited, and may for example be implemented in a similar manner to the fourth differential pressure gauge 322.

In some embodiments, the pressure points of the ambient outside 114 for the fourth differential pressure gauge 322 and the fifth differential pressure gauge 324 are the same as the first differential pressure gauge 122, second differential pressure gauge 124 and third differential pressure gauge 340. A special technical effect attributable to these specific embodiments is the avoidance of variations of readings of the ambient pressure between the first differential pressure gauge 122, the second differential pressure gauge 124, the third differential pressure gauge 340, the fourth differential pressure gauge 322 and the fifth differential pressure gauge 324.

The system 300 further comprises the controller unit 138 for controlling the air flow for cooling the data center comprising the first server room 102 and the second server room 302.

Functions and operations of the various components of the application 144 will now be described in greater details. Again, for simplicity, elements of the application 144 described in the system 100 that are similar to those of the system 300 have been labelled with the same reference numerals and will not be described again in detail herein.

Figure 4:
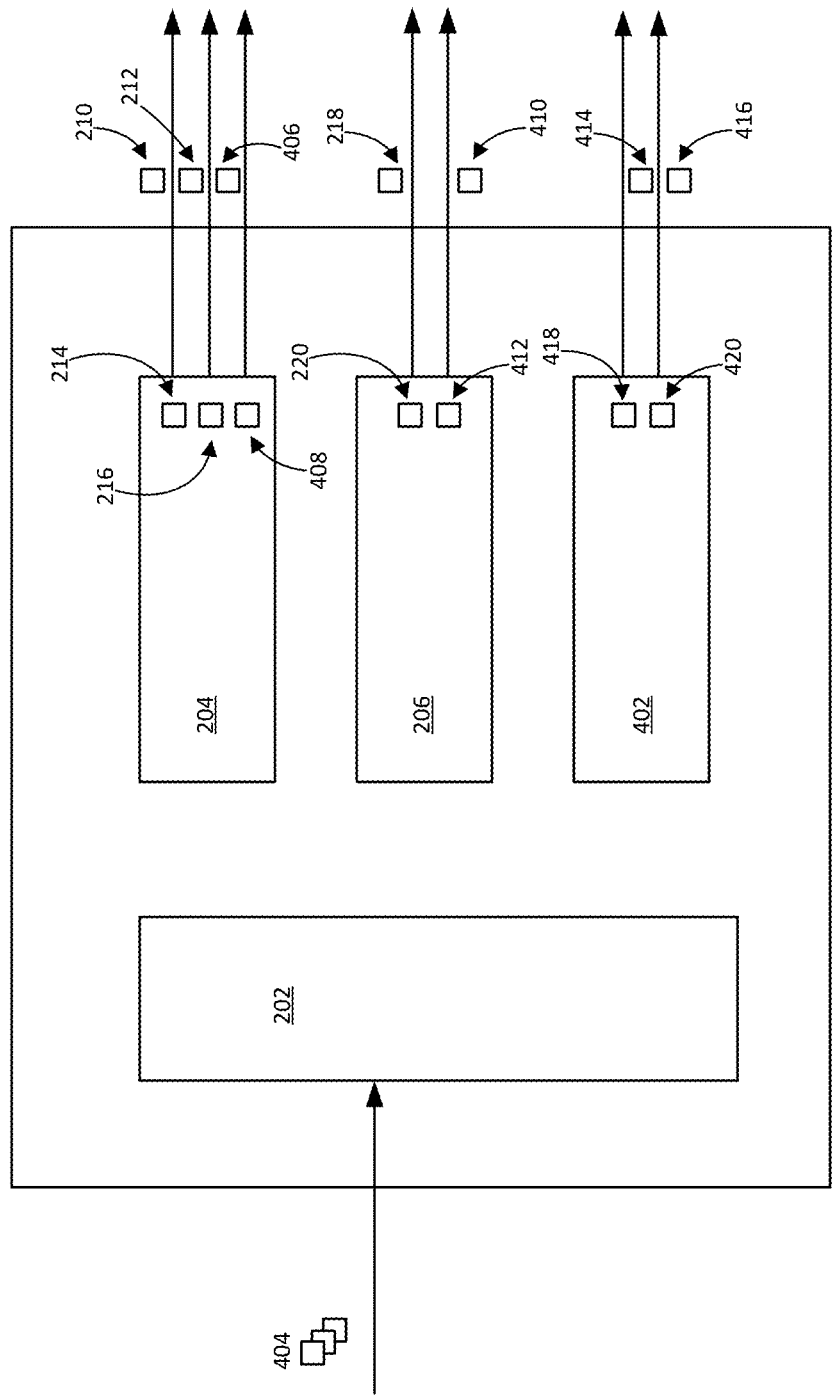
FIG. 4 depicts an example of a process of generating control signals by the controller unit of the system of FIG. 3.

With reference to FIG. 4, there is depicted a schematic illustration of the application 144 for controlling the air flow of the data center comprising the first server room 102 and the second server room 302. In addition to the measurement value acquisition routine 202, the fan control routine 204, the damper control routine 206 described above, the application 144 further executes a chamber damper control routine 402.

Functionalities of each one of the measurement value acquisition routine 202, the fan control routine 204, the damper control routine 206, and the chamber damper control routine 402, as well as data and/or information processed or stored therein are described below.

Receiving the Data

Each of the thermometer 136, the thermometer 336, the first differential pressure gauge 122, the second differential pressure gauge 124, the third differential pressure gauge 340, the fourth differential pressure gauge 322, the fifth differential pressure gauge 324 transmit sensed data to the controller unit 138 by virtue of data packets 404 transmitted to the controller unit 138. The data packets 404 include a respective data packet for each of the monitored measurements, and thus includes at least one data packet comprising a first temperature value sensed by the thermometer 136, a second temperature value sensed by the thermometer 336, at least one data packet comprising the first differential pressure value sensed by the first differential pressure gauge 122, at least one data packet comprising the second differential pressure value sensed by the second differential pressure gauge 124, at least one data packet comprising the third differential pressure value sensed by the third differential pressure gauge 340, at least one data packet comprising the fourth differential pressure value sensed by the fourth differential pressure gauge 322, and at least one data packet comprising the fifth differential pressure value sensed by the fifth differential pressure gauge 324.

Although the first differential pressure gauge 122, the second differential pressure gauge 124, the third differential pressure gauge 340, the fourth differential pressure gauge 322, and the fifth differential pressure gauge 324 have been depicted as hardware within FIG. 3, it is to be understood that it is not limited as such. Indeed it is contemplated that one or more of the first differential pressure gauge 122, the second differential pressure gauge 124, the third differential pressure gauge 340, the fourth differential pressure gauge 322, and the fifth differential pressure gauge 324 may be implemented as at least one software routine that is part of the measurement value acquisition routine 202 and configured to receive, via the data packets 404, the measured air pressures from their respective first and second pressure points (implemented as pressure gauges), and calculate the first, second, third, fourth and fifth differential pressure values.

Controlling the Fan Speed

Based on the data packets 404 received by the measurement value acquisition routine 202, the fan control routine generates the first control signal 210 for controlling the rotation speed of the inlet fan 118, the second control signal 212 for controlling the rotation speed of the outlet fan 132, and a fourth control signal 406 for controlling the rotation speed of the inlet fan 332.

The manner in which the first control signal 210 is generated by the first PID algorithm 214 has been described above and will not be described in detail herein.

The fourth control signal 406 is generated by a fourth PID algorithm 408 included within the fan control routine 204 that is configured to compare the fourth differential pressure value (determined by the fourth differential pressure gauge 322) to a fourth target value (described below). The fan control routine 204 generates and transmits the fourth control signal 406 which contains instructions for adjusting the rotation speed of the inlet fan 318 in order to achieve the fourth target value.

In some embodiments, the fourth target value is indicative of the target differential pressure value to be maintained within the cold chamber 304 in relation to the ambient outside 114. In some embodiments, the fourth target value is the same as the first target value. Needless to say, it is further contemplated that the fourth target value may be a different value. It is also contemplated that the controller unit 138 comprises, or is electrically coupled to, an input device (not shown) for receiving the fourth target value by the user.

In some embodiments, if it is determined that the fourth differential pressure value is below the fourth target value, the fourth control signal 406 contains instructions to increase the rotation speed of the inlet fan 318 in order to increase the amount of air entering the cold chamber 304, thereby increasing the pressure within the cold chamber 304 to achieve the fourth target value.

Alternatively, in some embodiments, if it is determined that the fourth differential pressure value is above the fourth target value, the fourth control signal 406 contains instructions to decrease the rotation speed of the inlet fan 318 in order to decrease the amount of air entering the cold chamber 304, thereby decreasing the pressure within the cold chamber 304 to achieve the fourth target value.

As has been discussed above with reference to FIG. 2, the second control signal 212 is generated by the second PID algorithm that is configured to compare the second differential pressure value (determined by the second differential pressure gauge 124) to the second target value.

In some embodiments of the present technology, the second target value is indicative of the target differential pressure value to be maintained within the second channel 126 and the second channel 326, near the air outlet 130. In some embodiments the second target value is 10 Pa (meaning that the pressure within the second channels 126, 326 is 10 Pa above the pressure of the ambient outside 114). Needless to say, it is further contemplated that the second target value may be a different value. It is also contemplated that the second target value is inputted from the user via the input device (not shown).

In some embodiments, if it is determined that the second differential pressure value is below the second target value (for example, the second differential pressure value is indicative of 8 Pa, meaning that the pressure within the second channels 126, 326 is 8 Pa above the pressure of the ambient outside 114), the second control signal 212 contains instructions to decrease the rotation speed of the outlet fan 132 in order to decrease the amount of heated air exiting into the ambient outside 114, thereby increasing the air pressure within the second channels 126, 326 to achieve the second target value.

In some embodiments, if it is determined that the second differential pressure value is above the second target value (for example, the second differential pressure value is indicative of 15 Pa, meaning that the pressure within the second channels 126, 326 is 15 Pa above the pressure of the ambient outside 114), the second control signal 212 contains instructions to increase the rotation speed of the outlet fan 132 in order to increase the amount of heated air exiting into the ambient outside 114, thereby decreasing the air pressure within the second channels 126, 326 to achieve the second target value.

In some embodiments, the first and fourth target values are above the second target value. In other words, the air pressure within the cold chambers 104, 304 are above the air pressure near the air outlet 130, thereby ensuring a flow of air from the cold chambers 104, 304 to the air outlet 130.

As it is apparent from the above description, the controller unit 138 generates the first control signal 210, the second control signal 212 and the fourth control signal 406 independently from one another. In other words, it can be said that the controller unit 138 independently controls operation of the inlet fan 118, the outlet fan 132 and the inlet fan 318. Therefore, broadly speaking, the controller unit 138 is configured to determine the difference between the (i) the first differential pressure value to the first target value; (ii) the second differential pressure value to the second target value; (iii) the fourth differential pressure value to the fourth target value, and to selectively adjust the speed of the associated inlet fan 118, outlet fan 132 and inlet fan 318 based on the so-determined difference. In other words, the controller unit 138 is configured to selectively control one of the inlet fan 118, the outlet fan 132, the inlet fan 318 based on determined mis-alignment between the associated (i) first differential pressure value and the first target value; (ii) second differential pressure value and the second target value; and (iii) the fourth differential pressure value and the fourth target value.

This is based on a few observations made by the developers. For example, developers observed that by only selectively controlling the speed of the inlet fan 118, outlet fan 132 and inlet fan 318 based on the monitored first, second and fourth differential pressure values, the solution presented by the present technology may achieve a better air flow for cooling the data center comprising the first server room 102 and second server room 302, and be less expensive in terms of computing resources and energy when compared to the prior art solutions, as embodiments of the present technology disclosed herein require processing less data compared to the prior art approaches.

Needless to say, although the first control signal 210, the second control signal 212 and the fourth control signal 406 have been described as being generated by the processor 142 executing the application 144, it is not limited as such. In some embodiments of the present technology, the controller unit 138 comprises the first PID controller (described above) the second PID controller (described above), and a third PID controller (not depicted) which are configured to generate the first control signal 210, second control signal 212, and the fourth control signal 406 respectively, in a manner similarly described above. Put another way, the independent control of the inlet fan 118, outlet fan 132 and inlet fan 318 can be implemented using one or more controllers implementing one or more PID control routines, which PID control routine can be implemented either in hardware, software or a combination thereof.

Controlling the Temperature

Based on the data packets 404 received by the measurement value acquisition routine 202, the damper control routine 206 generates the third control signal 218 for adjusting the opening of at least one of the first damper 116 and second damper 134, and a fifth control signal 410 for adjusting the opening of at least one of the first damper 316 and second damper 334.

The manner in which the third control signal 218 is generated by the third PID algorithm 220 has been described above, and therefore will not be described herein.

The fifth control signal 410 is generated by a fifth PID algorithm 412 included within the damper control routine 206, which is configured to compare the second temperature value sensed by the thermometer 336 to a second temperature target value. The damper control routine 206 generates and transmits the fifth control signal 410 which contains instructions for adjusting the opening of the first and/or second dampers 316, 334 in order to achieve the second temperature target value.

In some embodiments of the present technology, the second temperature target value is indicative of a target temperature to be maintained within the cold chamber 304. In some embodiments, the second temperature target value is the same as the first temperature target value. Needless to say, it is further contemplated that the second temperature target value is different from the first temperature target value. It is also contemplated that the second temperature target value is inputted from the user via the input device (not shown).

In some embodiments, if it is determined that the second temperature value is below the second temperature target value, the fifth control signal 410 contains at least one instruction of (i) increasing the opening of the second damper 334 so as to increase the amount of heated air from the hot chamber 306 to be "recycled" or directed into the cold chamber 304, and/or (ii) decrease the opening of the first damper 316 so as to decrease the amount of air from the ambient outside 114 directed into the cold chamber 304, so as to achieve the second temperature target value.

Alternatively, in some embodiments, if it is determined that the second temperature value is above the second temperature target value, the fifth control signal 410 contains at least one instruction of (i) increasing the opening of the first damper 316 so as to increase the amount of air from the ambient outside 114 directed into the cold chamber 304, and/or (ii) decrease the opening of the second damper 334 so as to decrease the amount heated air from the hot chamber 306 to be directed into the cold chamber 304, so as to achieve the second temperature target value.

Controlling the Chamber Dampers

Based on the data packets 404 received by the measurement value acquisition routine 202, the chamber damper control routine 402 generates a sixth control signal 414 for controlling the first chamber damper 338 for adjusting the opening of the first chamber damper 338 and a seventh control signal 416 for adjusting the opening of the second chamber damper 342.

The manner in which the sixth control signal 414 is generated is now explained. In some embodiments, the chamber damper control routine 402 comprises a sixth PID algorithm 418. The sixth PID algorithm 418 is configured to compare the third differential pressure value (determined by the third differential pressure gauge 340) to a third target value (described below). The chamber damper control routine 402 generates and transmits the sixth control signal 414 which contains instructions for adjusting the opening of the first chamber damper 338 in order to achieve the third target value.

In some embodiments of the present technology, the third target value is indicative of the target differential pressure value to be maintained within the first portion of the hot chamber 106 in relation to the ambient outside 114.

In some embodiments, if it is determined that the third differential pressure value is below the third target value, the sixth control signal 414 contains instructions to decrease the opening of the first chamber damper 338 in order to decrease the amount of heated air flowing into the second portion of the hot chamber 106, thereby increasing the pressure within the first portion of the hot chamber 106 to achieve the third target value.

Alternatively, in some embodiments, if it is determined that the third differential pressure value is above the third target value, the sixth control signal 414 contains instructions to increase the opening of the first chamber damper 338 in order to increase the amount of heated air flowing into the second portion of the hot chamber 106, thereby decreasing the pressure within the first portion of the hot chamber 106 to achieve the third target value.

In some embodiments, if it is determined that the third differential pressure value matches the third target value, the chamber damper control routine 402 does not generate the sixth control signal 414. Alternatively, the chamber damper control routine 402 may also be configured to generate the sixth control signal 414, which contains instructions to maintain the opening degree of the first chamber damper 338, upon determining that the third differential pressure value matches the third target value.

The manner in which the seventh control signal 416 is generated is now explained. In some embodiments, the chamber damper control routine 402 comprises a seventh PID algorithm 420 (in addition to the sixth PID algorithm 418. The seventh PID algorithm 420 is configured to compare the fifth differential pressure value to a fifth target value. The chamber damper control routine 402 generates and transmits the seventh control signal 416 which contains instructions for adjusting the opening of the second chamber damper 342.

In some embodiments, the fifth target value is indicative of the target differential pressure value to be maintained within the first portion of the hot chamber 306 in relation to the ambient outside 114. It is contemplated that the third target value and the fifth target value is inputted from the user via the input device (not shown).

In some embodiments, the chamber damper control routine 402 is configured to allow an equal amount of heated air to pass from the first portion of the hot chamber 106, and the first portion of the hot chamber 306, respectively, toward inter alia, the second channels 126, 326. As such, where the size of the server room and the hardware used therein (such as the servers 110, 310) are the same between the first server room 102 and the second server room 302, the fifth target value may be the same as the third target value. Alternatively, where the size of the server room and the hardware used therein are not the same between the first server room 102 and the second server room 302, the fifth target value may be different to achieve equal amount of heated air to go into the second channel 326.

In some embodiments, if it is determined that the fifth differential pressure value is below the fifth target value, the seventh control signal 416 contains instructions to decrease the opening of the second chamber damper 342 in order to decrease the amount of heated air flowing into the second portion of the hot chamber 306, thereby increasing the pressure within the first portion of the hot chamber 306 to achieve the fifth target value.

Alternatively, in some embodiments, if it is determined that the fifth differential pressure value is above the fifth target value, the seventh control signal 416 contains instructions to increase the opening of the second chamber damper 342 in order to increase the amount of heated air flowing into the second portion of the hot chamber 306, thereby decreasing the pressure within the first portion of the hot chamber 306 to achieve the fifth target value.

In some embodiments, if it is determined that the fifth differential pressure value matches the fifth target value, the chamber damper control routine 402 does not generate the seventh control signal 416. Alternatively, the chamber damper control routine 402 may also be configured to generate the seventh control signal 416, which contains instructions to maintain the opening degree of the second chamber damper 342, upon determining that the fifth differential pressure value matches the fifth target value.

Under certain circumstances, the first target value can be above the third target value. In other words, the air pressure within the cold chamber 104 can be maintained to be above the air pressure within the first portion of the hot chamber 106. As such, air from the first portion of the hot chamber 106 is prevented from flowing into the cold chamber 104, and a required air flow from the cold chamber 104 into the first portion of the hot chamber 106 is ensured. Similarly, under certain circumstances, the third target value can be above the second target value. In other words, the air pressure within the first portion of the hot chamber 106 can be maintained to be above the air pressure near the air outlet 130. As such, the heated air within the second channels 126, 326 is prevented from flowing into the first portion of the hot chamber 106, and a required air flow from the first portion of the hot chamber 106 towards the air outlet 130 is ensured.

Under certain circumstances, the fourth target value can be above the fifth target value. In other words, the air pressure within the cold chamber 304 can be above the air pressure within the first portion of the hot chamber 306. As such, air from the first portion of the hot chamber 306 is prevented from flowing into the cold chamber 304, and a required air flow from the cold chamber 304 into the first portion of the hot chamber 306 is ensured. Similarly, under certain circumstances, the fifth target value can be above the second target value. In other words, the air pressure within the first portion of the hot chamber 306 can be maintained to be above the air pressure near the air outlet 130. As such, the heated air within the second channels 126, 326 is prevented from flowing into the first portion of the hot chamber 306, and a required air flow from the first portion of the hot chamber 306 towards the air outlet 130 is ensured.

It should be expressly understood that although the present technology has been explained with reference to a data center comprising a single server room, and two server rooms, this description is not intended to define the scope or set forth the bounds of the present technology. It should be apparent to those skilled in the art that the present technology may provide a technical solution of controlling the air flow within a data center having more than two server rooms.

Figure 5:
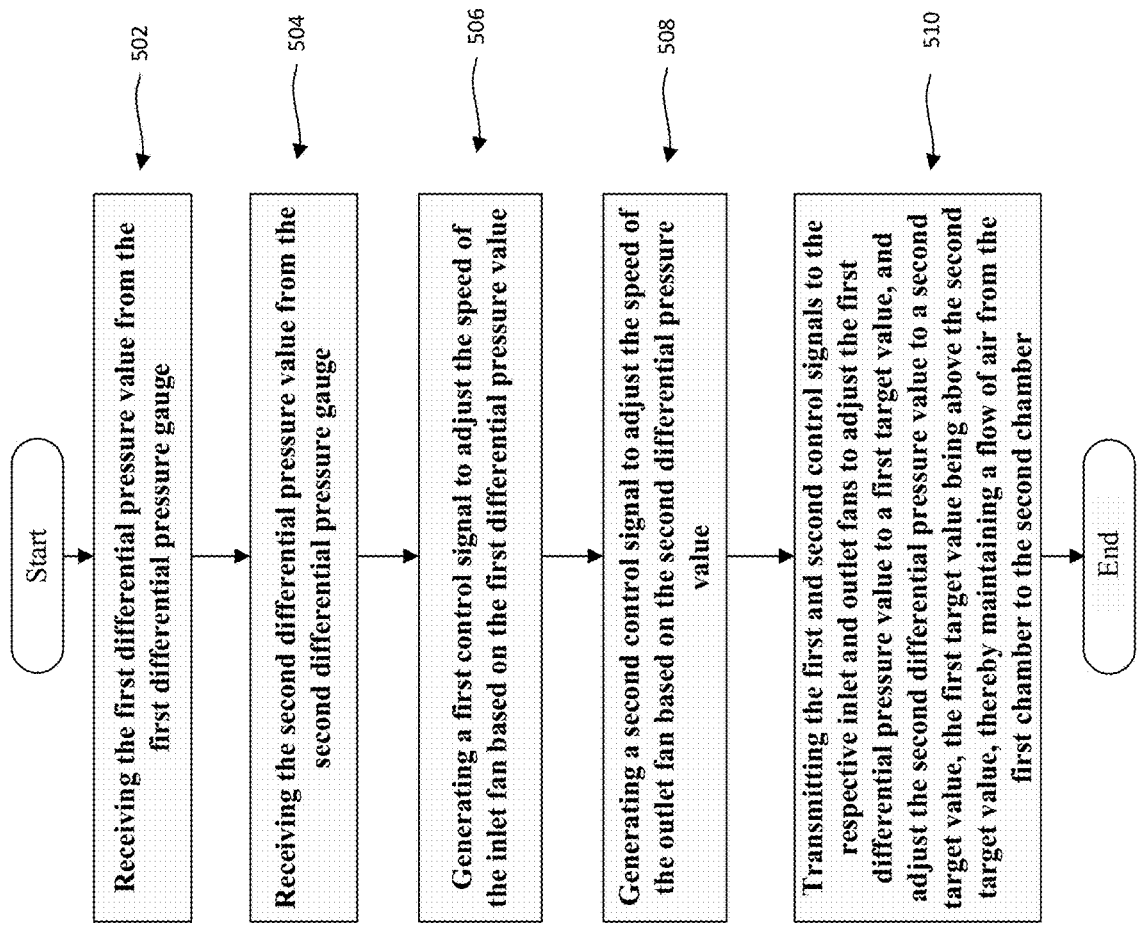
FIG. 5 depicts a block diagram of a flow cart of a method for controlling air flow for cooling a data center comprising a server room in accordance with non-limiting embodiments of the present technology.

Given the architecture and examples provided herein above, it is possible to execute a computer-implemented method of air flow control for cooling a server room. With reference to FIG. 5, there is depicted a flow chart of a method 500, the method 500 being executable in accordance with non-limiting embodiments of the present technology. The method 500 can be executed by the controller unit 138.

Step 502: Receiving the First Differential Pressure Value from the First Differential Pressure Gauge The method 500 will be explained below with reference to two scenarios. The first scenario will be directed towards the embodiment illustrated in FIG. 1, whereas the second scenario will be directed towards the embodiments illustrated in FIG. 3.

The method 500 starts at step 502.

Scenario 1:

The controller unit 138 receives the data packets 208 which include a data packet comprising the first differential pressure value sensed by the first differential pressure gauge 122.

Scenario 2:

The controller unit 138 receives the data packets 404 which include either a data packet comprising the first differential pressure value sensed by the first differential pressure gauge 122, and a fourth differential pressure value sensed by the fourth differential pressure gauge 322.

Step 504: Receiving the Second Differential Pressure Value from the Second Differential Pressure Gauge Scenario 1:

At step 504, as part of receiving the data packets 208, the controller unit 138 also receives another data packet comprising the second differential pressure value sensed by the second differential pressure gauge 124.

Scenario 2:

At step 504, as part of receiving the data packets 404, the controller unit 138 also receives another data packet comprising the second differential pressure value sensed by the second differential pressure gauge 124.

Step 506: Generating a First Control Signal to Adjust the Speed of the Inlet Fan Based on the First Differential Pressure Value Scenario 1:

At step 506, the controller unit 138 is configured to generate the first control signal 210.

The first differential pressure value obtained in step 502 is fed to the controller unit 138 (or alternatively, to the first PID controller) which is configured to execute the first PID algorithm 214. The first PID algorithm 214 is configured to compare the first differential pressure value to the first target value previously inputted by the user.

In some embodiments, if it is determined that the first differential pressure value is below the first target value, the generated first control signal 210 contains instructions to increase the rotation speed of the inlet fan 118 to increase the amount of air within the first channel 109 entering the cold chamber 104.

Alternatively, in some embodiments, if it is determined that the first differential pressure value is above the first target value, the generated first control signal 210 contains instructions to decrease the rotation speed of the inlet fan 118 in order to decrease the amount of air within the first channel 109 entering the cold chamber 104.

Scenario 2:

At step 506, the controller unit 138 is configured to generate one of the first control signal 210 or the fourth control signal 406, depending on the information contained within the data packet received in step 502.

Assuming that the data packet received in step 502 contains the first differential pressure value sensed by the first differential pressure gauge 122, if it is determined that the first differential pressure value is below the first target value, the generated first control signal 210 contains instructions to increase the rotation speed of the inlet fan 118 to increase the amount of air within the first channel 109 entering the cold chamber 104.

Alternatively, in some embodiments, if it is determined that the first differential pressure value is above the first target value, the generated first control signal 210 contains instructions to decrease the rotation speed of the inlet fan 118 in order to decrease the amount of air within the first channel 109 entering the cold chamber 104.

The manner in which the fourth control signal 406 is generated has been described above, and therefore will not be described again.

Step 508: Generating a Second Control Signal to Adjust the Speed of the Outlet Fan Based on the Second Differential Pressure Value Scenario 1 and 2:

At step 508, the controller unit 138 is configured to generate the second control signal 212.

The second differential pressure value obtained in step 504 is fed to the controller unit 138 (or alternatively, to the second PID controller) which is configured to execute the second PID algorithm 216. The second PID algorithm 216 is configured to compare the second differential pressure value to the second target value previously inputted by the user.

In some embodiments, if it is determined that the second differential pressure value is below the second target value, the generated second control signal 212 contains instructions to decrease the rotation speed of the outlet fan 132 to decrease the amount of heated air exiting the hot chamber 106.

Alternatively, in some embodiments, if it is determined that the second differential pressure value is above the second target value, the generated second control signal 212 contains instructions to increase the rotation speed of the outlet fan 132 to increase the amount of heated air exiting the hot chamber 106.

Step 510: Transmitting the First and Second Control Signals to the Respective Inlet and Outlet Fans to Adjust the First Differential Pressure Value to a First Target Value, and Adjust the Second Differential Pressure Value to a Second Target Value, the First Target Value being Above the Second Target Value, Thereby Maintaining a Flow of Air from the First Chamber to the Second Chamber Scenario 1:

At step 510, the controller unit 138 transmits the first control signal 210 to the inlet fan 118, and the second control signal 212 to the outlet fan 132.

In response to receiving the first control signal 210, the inlet fan 118 adjusts the rotating speed in accordance with the instructions contained within the first control signal 210. As such, by increasing or decreasing the amount of air flowing from the first channel 109 into the cold chamber 104, the first differential pressure value is adjusted to the first target value.

In response to receiving the second control signal 212, the outlet fan 132 adjusts the rotating speed in accordance with the instructions contained within the second control signal 212. As such, by increasing or decreasing the amount of air flowing from the hot chamber 106 into the ambient outside 114, the second differential pressure value is adjusted to the second target value.

Scenario 2:

At step 510, the controller unit 138 transmits either one of the first control signal 210 and fourth control signal 406 generated in step 506 to the respective inlet fans 118, 318, and the second control signal 212 to the outlet fan 132.

Assuming that it is the first control signal 210 that has been generated in step 506, upon receiving the first control signal 210, the inlet fan 118 adjusts the rotating speed in accordance with the instructions contained within the first control signal 210. As such, by increasing or decreasing the amount of air flowing from the first channel 109 into the cold chamber 104, the first differential pressure value is adjusted to the first target value.

The manner in which the inlet fan 318 adjusts the rotating speed in accordance with the instructions contained within the fourth control signal 406 has been described above, and therefore will not be described again.

In response to receiving the second control signal 212, the outlet fan 132 adjusts the rotating speed in accordance with the instructions contained within the second control signal 212. As such, by increasing or decreasing the amount of air flowing from the hot chamber 106 into the ambient outside 114, the second differential pressure value is adjusted to the second target value.

It should be apparent to those skilled in the art that at least some embodiments of the present technology aim to expand a range of technical solutions for addressing a particular technical problem, namely controlling the air flow within a data center having one or more server rooms, thus improving energy consumption and decreasing computation burden on the conventional controllers.

It should be expressly understood that not all technical effects mentioned herein need to be enjoyed in each and every implementation of the present technology. For example, implementations of the present technology may be implemented without the user enjoying some of these technical effects, while other implementations may be implemented with the user enjoying other technical effects or none at all.

Modifications and improvements to the above-described implementations of the present technology may become apparent to those skilled in the art. The foregoing description is indented to be exemplary rather than limiting. The scope of the present technology is therefore intended to be limited solely by the scope of the appended claims.

While the above-described implementations have been described and shown with reference to particular steps performed in a particular order, it will be understood that these steps may be combined, sub-divided, or re-ordered without departing from the teachings of the present technology. Accordingly, the order and grouping of the steps is not a limitation of the present technology.

The invention claimed is:

1. An air flow control method for cooling a data center comprising at least a first server room and a second server room, the first server room comprising a first chamber and a second chamber partitioned therebetween by a first server rack and being in fluid communication therebetween via the first server rack, the first chamber having a first air inlet fluidly coupled to an outside area of the server room, the second chamber having an air outlet fluidly coupled to the outside area, the second server room comprising a third chamber and a fourth chamber partitioned therebetween by a second server rack and being in fluid communication therebetween via the second server rack, the third chamber having a second air inlet fluidly coupled to the outside of the data center, and the fourth chamber being fluidly coupled to the second chamber, the method being executable by a controller unit coupled to:

a first damper partitioning the second chamber into a first portion and a second portion fluidly coupled to the air outlet, the first damper configured to control the amount of air to flow from the first portion into the second portion;

a second damper partitioning the fourth chamber into a third portion and a fourth portion fluidly coupled to the air outlet, the second damper configured to control the amount of air to flow from the third portion into the fourth portion;

a first inlet fan configured to flow air from the outside area into the first chamber at different speeds, via the first air inlet;

a second inlet fan configured to flow air from the outside area into the third chamber at different speeds via the second inlet;

an outlet fan configured to flow air from the second chamber into the outside area at different speeds, via the air outlet;

a first differential pressure gauge configured to measure a first differential pressure value of an air pressure of the first chamber relative to an air pressure of the outside area;
a second differential pressure gauge configured to measure a second differential pressure value of an air pressure of the second chamber relative to the air pressure of the outside area;
a third differential pressure gauge configured to measure a third differential pressure value of an air pressure of the third chamber relative to the air pressure of the outside area;
a fourth differential pressure gauge configured to measure a fourth differential pressure value of an air pressure of the first portion relative to the air pressure of the outside area;
a fifth differential pressure gauge configured to measure a fifth differential pressure value of an air pressure of the third portion relative to the air pressure of the outside area; and
the method comprising:
  receiving the first differential pressure value from the first differential pressure gauge;
  receiving the second differential pressure value from the second differential pressure gauge;
  receiving the third differential pressure value from the third differential pressure gauge;
  receiving the fourth differential pressure value from the fourth differential pressure gauge;
  receiving the fifth differential pressure value from the fifth differential pressure gauge;
  generating a first control signal to adjust the speed of the first inlet fan based on the first differential pressure value;
  generating a second control signal to adjust the speed of the outlet fan based on the second differential pressure value;
  generating a third control signal to adjust the speed of the second inlet fan, based on the third differential pressure value;
  generating a fourth control signal to adjust the opening of the first damper based on the fourth differential pressure value;
  generating a fifth control signal to adjust the opening of the second damper based on the fifth differential pressure value;
  transmitting the first, the second and the third control signals to the respective inlet and outlet fans to adjust the first differential pressure value to a first target value, the second differential pressure value to a second target value, and the third differential value to a third target value, the first target value being above the second target value, thereby maintaining a flow of air from the first chamber to the second chamber; and
  transmitting the fourth and fifth control signals to the respective first and second dampers to adjust the fourth differential pressure value to a fourth target value, and adjust the fifth differential pressure value to a fifth target value, the fourth target value being below the first target value and above the second target value, the fifth target value being below the third target value and above the second target value.

2. The method of claim 1, wherein the generating the first control signal is executed independently from the generating the second control signal.

3. The method of claim 1, wherein the controller unit is configured to execute a first PID algorithm and a second PID algorithm, the first PID algorithm executing the generating the first control signal and the second PID algorithm executing the generating the second control signal.

4. The method of claim 1, wherein the controller unit comprises a first PID controller and a second PID controller, the first PID controller executing the generating the first control signal and the second PID controller executing the generating the second control signal.

5. The method of claim 1, wherein the maintaining the flow of air from the first chamber to the second chamber comprises maintaining the air pressure of the first chamber to be above the air pressure of the second chamber.

6. The method of claim 1, wherein in response to determining that the first differential pressure value is above the first target value, the first control signal comprising instructions for decreasing the inlet fan speed.

7. The method of claim 1, wherein in response to determining that the first differential pressure value is below the first target value, the first control signal comprising instructions for increasing the inlet fan speed.

8. The method of claim 1, wherein in response to determining that the second differential pressure value is below the second target value, the second control signal comprising instructions for decreasing the outlet fan speed.

9. The method of claim 1, wherein in response to determining that the second differential pressure value is above the second target value, the second control signal comprising instructions for increasing the outlet fan speed.

10. The method of claim 1, wherein:
the controller unit is further coupled to
  a third damper fluidly coupling the outside area and the first air inlet, the first damper configured to control the amount of air from the outside area to flow into the first air inlet;
  a fourth damper fluidly coupling the second chamber and the second air inlet, the second damper configured to control the amount of air from the second chamber to flow into the second air inlet;
  a thermometer configured to measure a temperature value of the air entering the air inlet;
the method further comprising:
  adjusting the air temperature value to a temperature target value by controlling the third and fourth dampers.

11. The method of claim 1, wherein both the first differential pressure gauge and the second differential pressure gauge comprise a respective first inlet and a second inlet, the respective first inlets receiving the air pressure of the outside area; and wherein the respective first inlets are coupled to a single pressure point for sensing the air pressure of the outside area at a single location.

12. The method of claim 1, wherein both the first differential pressure gauge and the second differential pressure gauge are implemented as at least one software routine executable by the controller unit, the controller unit being coupled to a first pressure gauge installed within the first chamber, a second pressure gauge installed within the second chamber, and a third pressure gauge installed within the outside area, wherein:
  receiving the first differential pressure value from the first differential pressure gauge comprises:
    receiving the air pressures measured by the first and third pressure gauges; and calculating the first differential pressure value based on the air pressures measured by the first and third pressure gauges; and receiving the second differential pressure value from the second differential pressure gauge comprises:

receiving the air pressures measured by the second and third pressure gauges; and calculating the second differential pressure value based on the air pressures measured by the second and third pressure gauges.

13. The method of claim 1, wherein in response to determining that the third differential pressure value is above the third target value, the third control signal comprising instructions for decreasing the second inlet fan speed.

14. The method of claim 1, wherein in response to determining that the third differential pressure value is below the third target value, the third control signal comprising instructions for increasing the second inlet fan speed.

15. The method of claim 1, wherein:

in response to determining that the fourth differential pressure value is above the fourth target value, the fourth control signal comprising instructions for increasing an opening of the first damper; and in response to determining that the fifth differential pressure value is above the fifth target value, the fifth control signal comprising instructions for increasing an opening of the second damper.

16. The method of claim 1, wherein:

in response to determining that the fourth differential pressure value is below the fourth target value, the fourth control signal comprising instructions for decreasing an opening of the first damper; and in response to determining that the fifth differential pressure value is below the fifth target value, the fifth control signal comprising instructions for decreasing an opening of the second damper.

17. The method of claim 1, wherein the second differential pressure gauge is placed fluidly downstream of the second and fourth portions.

18. The method of claim 17, wherein in response to determining that the second differential pressure value is below the second target value, the second control signal comprising instructions for decreasing the outlet fan speed.

19. The method of claim 17, wherein in response to determining that the second differential pressure value is above the second target value, the second control signal comprising instructions for increasing the outlet fan speed.

20. An air flow control method for cooling a data center comprising at least a first server room and a second server room, the first server room comprising a first chamber and a second chamber partitioned therebetween by a first server rack and being in fluid communication therebetween via the first server rack, the first chamber having a first air inlet fluidly coupled to an outside area of the server room, the second chamber having an air outlet fluidly coupled to the outside area, the second server room comprising a third chamber and a fourth chamber partitioned therebetween by a second server rack and being in fluid communication therebetween via the second server rack, the third chamber having a second air inlet fluidly coupled to the outside of the data center, and the fourth chamber being fluidly coupled to the second chamber, the method being executable by a controller unit coupled to:

a first damper partitioning the second chamber into a first portion and a second portion fluidly coupled to the air outlet, the first damper configured to control the amount of air to flow from the first portion into the second portion;

a second damper partitioning the fourth chamber into a third portion and a fourth portion fluidly coupled to the air outlet, the second damper configured to control the amount of air to flow from the third portion into the fourth portion;

a first inlet fan configured to flow air from the outside area into the first chamber at different speeds, via the first air inlet;

a second inlet fan configured to flow air from the outside area into the third chamber at different speeds via the second inlet;

an outlet fan configured to flow air from the second chamber into the outside area at different speeds, via the air outlet;

a first differential pressure gauge configured to measure a first differential pressure value of an air pressure of the first chamber relative to an air pressure of the outside area;

a second differential pressure gauge configured to measure a second differential pressure value of an air pressure of the second chamber relative to the air pressure of the outside area;

a third differential pressure gauge configured to measure a third differential pressure value of an air pressure of the third chamber relative to the air pressure of the outside area;

a fourth differential pressure gauge configured to measure a fourth differential pressure value of an air pressure of the first portion relative to the air pressure of the outside area;

a fifth differential pressure gauge configured to measure a fifth differential pressure value of an air pressure of the third portion relative to the air pressure of the outside area; and the method comprising:

receiving the first differential pressure value from the first differential pressure gauge;

receiving the second differential pressure value from the second differential pressure gauge;

receiving the third differential pressure value from the third differential pressure gauge;

receiving the fourth differential pressure value from the fourth differential pressure gauge;

receiving the fifth differential pressure value from the fifth differential pressure gauge;

in response to one of the first differential pressure value, the second differential pressure value, the third differential pressure value, the fourth differential pressure value and the fifth differential pressure value not matching its respective first, second, third, fourth and fifth target value, generating a control signal to adjust one of the speed of an associated one of the first inlet fan, the second inlet fan, the outlet fan, and an opening of the first damper and the second damper;

transmitting the control signal to the associated one of the first inlet fan, the second inlet fan, the outlet fan, the first damper and the second damper.

21. An air flow control system for cooling a data center comprising at least a first server room, the first server room comprising a first chamber and a second chamber partitioned therebetween by a first server rack and being in fluid communication therebetween via the first server rack, the first chamber having a first air inlet fluidly coupled to an outside area of the server room, the second chamber having an air outlet fluidly coupled to the outside area, the second server room comprising a third chamber and a fourth chamber partitioned therebetween by a second server rack and being in fluid communication therebetween via the second server rack, the third chamber having a second air inlet fluidly coupled to the outside of the data center, and the fourth chamber being fluidly coupled to the second chamber, the system comprising:
- a first damper partitioning the second chamber into a first portion and a second portion fluidly coupled to the air outlet, the first damper configured to control the amount of air to flow from the first portion into the second portion;
- a second damper partitioning the fourth chamber into a third portion and a fourth portion fluidly coupled to the air outlet, the second damper configured to control the amount of air to flow from the third portion into the fourth portion;
- a first inlet fan configured to flow air from the outside area into the first chamber at different speeds, via the first air inlet;
- an outlet fan configured to flow air from the second chamber into the outside area at different speeds, via the air outlet;
- a first differential pressure gauge configured to measure a first differential pressure value of an air pressure of the first chamber relative to an air pressure of the outside area;
- a second differential pressure gauge configured to measure a second differential pressure value of an air pressure of the second chamber relative to the air pressure of the outside area;
- a third differential pressure gauge configured to measure a third differential pressure value of an air pressure of the third chamber relative to the air pressure of the outside area;
- a fourth differential pressure gauge configured to measure a fourth differential pressure value of an air pressure of the first portion relative to the air pressure of the outside area;
- a fifth differential pressure gauge configured to measure a fifth differential pressure value of an air pressure of the third portion relative to the air pressure of the outside area; and
- a controller unit coupled to the first damper, the second damper, the first inlet fan, the second inlet fan, the outlet fan, the first differential pressure gauge, the second differential pressure gauge, the third differential pressure gauge, the fourth differential pressure gauge and the fifth differential pressure gauge, the controller unit comprising a processor configured to:
- receive the first differential pressure value from the first differential pressure gauge;
- receive the second differential pressure value from the second differential pressure gauge;
- receive the third differential pressure value from the third differential pressure gauge;
- receive the fourth differential pressure value from the fourth differential pressure gauge;
- receive the fifth differential pressure value from the fifth differential pressure gauge;
- generate a first control signal to adjust the speed of the inlet fan based on the first differential pressure value;
- generate a second control signal to adjust the speed of the outlet fan based on the second differential pressure value;
- generate a third control signal to adjust the speed of the second inlet fan, based on the third differential pressure value;
- generate a fourth control signal to adjust the opening of the first damper based on the fourth differential pressure value;
- generate a fifth control signal to adjust the opening of the second damper based on the fifth differential pressure value;
- transmit the first, the second and the third control signals to the respective inlet and outlet fans to adjust the first differential pressure value to a first target value, the second differential pressure value to a second target value, and the third differential value to a third target value, the first target value being above the second target value, thereby maintaining a flow of air from the first chamber to the second chamber; and
- transmit the fourth and fifth control signals to the respective first and second dampers to adjust the fourth differential pressure value to a fourth target value, and adjust the fifth differential pressure value to a fifth target value, the fourth target value being below the first target value and above the second target value, the fifth target value being below the third target value and above the second target value.

* * * * *